(12) United States Patent
Sasaki et al.

(10) Patent No.: US 7,893,192 B2
(45) Date of Patent: Feb. 22, 2011

(54) PI-CONJUGATED POLYMER

(75) Inventors: Masaomi Sasaki, Susono (JP);
Masafumi Torii, Yokohama (JP);
Takashi Okada, Yokohama (JP);
Toshiya Sagisaka, Yokohama (JP)

(73) Assignee: Ricoh Company, Ltd., Tokyo (JP)

( * ) Notice: Subject to any disclaimer, the term of this patent is extended or adjusted under 35 U.S.C. 154(b) by 18 days.

(21) Appl. No.: 11/682,641

(22) Filed: Mar. 6, 2007

(65) Prior Publication Data

US 2007/0213503 A1 Sep. 13, 2007

(30) Foreign Application Priority Data

Mar. 9, 2006 (JP) ............................. 2006-063531
Dec. 6, 2006 (JP) ............................. 2006-329068

(51) Int. Cl.
*C08G 61/00* (2006.01)
*C08G 73/24* (2006.01)
*C08G 65/22* (2006.01)

(52) U.S. Cl. ...................... 528/396; 528/394; 528/397; 528/401; 528/402

(58) Field of Classification Search ......... 528/396–397, 528/401–402, 380, 394; 521/82; 478/690, 478/917; 427/407.1; 313/503
See application file for complete search history.

(56) References Cited

U.S. PATENT DOCUMENTS

| | | | | |
|---|---|---|---|---|
| 4,134,761 A | * | 1/1979 | Okazaki et al. | ............ 430/58.6 |
| 5,777,070 A | * | 7/1998 | Inbasekaran et al. | ........ 528/394 |
| 5,814,244 A | | 9/1998 | Kreuder et al. | |
| 5,962,631 A | | 10/1999 | Woo et al. | |
| 6,353,083 B1 | * | 3/2002 | Inbasekaran et al. | ........ 528/295 |
| 2006/0247413 A1 | | 11/2006 | Sasaki et al. | |

FOREIGN PATENT DOCUMENTS

| | | |
|---|---|---|
| JP | 8-157575 | 6/1996 |
| JP | 10-310635 | 11/1998 |
| JP | 2002-515078 | 5/2002 |
| JP | 2002-536492 | 10/2002 |
| JP | 2004-339206 | 12/2004 |
| JP | 2005-82483 | 3/2005 |
| JP | 2005-240001 | 9/2005 |
| WO | WO 97/09394 | 3/1997 |
| WO | WO 00/46321 | 8/2000 |

OTHER PUBLICATIONS

Norio Miyaura, et al., "Palladium-Catalyzed Cross-Coupling Reactions of Organoboron Compounds", Chemical Reviews, vol. 95, No. 7, XP-002435837, 1995, pp. 2457-2483.

H. Rost, et al., "Novel light emitting and photoconducting polyarylenevinylene derivatives containing phenylene arylamine and phenylene oxide units in the main chain", Synthetic Metals, 84, 1997, pp. 269-270.

Maxime Ranger, et al., "New Base-Doped Polyfluorene Derivatives", Macromolecules, 32, 1999, pp. 3306-3313.

* cited by examiner

*Primary Examiner*—Vasu Jagannathan
*Assistant Examiner*—Hannah Pak
(74) *Attorney, Agent, or Firm*—Oblon, Spivak, McClelland, Maier & Neustadt, L.L.P.

(57) ABSTRACT

Provided are pi-conjugated polymer materials that are useful for photoelectric transducer elements having high hole transportability and excellent durability, that are useful for light-emitting elements having superior emitting properties and excellent durability, and that are useful for active layers of thin film transistors. The pi-conjugated polymers comprise a constitutional unit expressed by the General Formula (I) or (II):

General Formula (I)

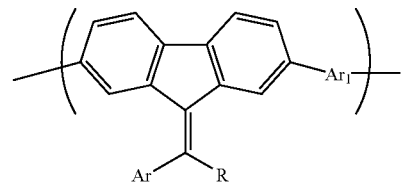

in which, Ar represents an aromatic hydrocarbon group or a heterocyclic group that may have a substituent; R represents a hydrogen atom, an alkyl group or an aromatic hydrocarbon group that may have a substituent; $Ar_1$ represents a divalent group of an aromatic hydrocarbon or a heterocycle that may have a substituent;

General Formula (II)

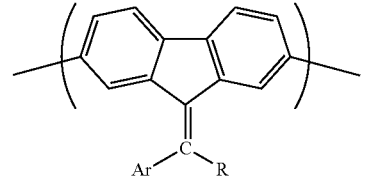

in which, Ar represents an aromatic hydrocarbon group or a heterocyclic group that may have a substituent; R represents a hydrogen atom, an alkyl group or an aromatic hydrocarbon group that may have a substituent.

18 Claims, 11 Drawing Sheets

PI-CONJUGATED POLYMER

BACKGROUND OF THE INVENTION

1. Field of the Invention

The present invention relates to novel pi-conjugated polymers that may be variously useful organic electronics materials for photoelectric transducer elements, thin-film transistor elements, light-emitting elements, etc.

2. Description of the Related Art

There have been proposed, on the basis of light-emitting properties or charge transport properties of organic materials, a wide variety of function elements such as photoelectric transducer elements, thin-film transistor elements, light-emitting elements etc. The organic materials of these elements are anticipated to bring about greatest advantages of organic materials such as lightweight, cheapness, lower production cost, flexibility, etc.

Among these function elements, various low molecular-weight materials or polymer materials have been proposed or reported for hole-transport materials of solar cells or electrophotographic photoconductors in particular; typically, the former has been demanded for higher efficiency and the latter has been demanded for high-speed printing and durability.

As for materials of light-emitting elements, a wide variety of low molecular-weight or polymer materials have been reported. It is reported in the low molecular-weight materials that various laminate structures may achieve higher efficiency and suitably controlled doping processes may improve durability. However, it is also reported that, when the products are mass of low molecular-weight materials, films tend to change their conditions gradually with time; as such, there essentially exists an inevitable problem in terms of film stability.

On the other hand, polymer materials have been vigorously investigated with respect to poly-p-phenylenevinylene (PPV) and its derivatives or polythiophenes in particular. However, these materials suffer from unsatisfactory purity and/or low fluorescence quantum yield in nature, thus high-quality light-emitting elements have not currently achieved.

In view of superior stability of polymer materials by virtue of their glassy state in nature, excellent light-emitting elements can be realized provided that polymer materials are allowed to take higher fluorescence quantum yield, thus further investigations are being conducted under this concept. For example, polymer materials with a repeated unit of arylamine are the intended ones (see U.S. Pat. No. 5,777,070, Japanese Patent Application Laid-Open (JP-A) No. 10-310635, JP-A No. 08-157575, JP-A No. 2002-515078, WO 97/09394, and Synth. Met., 84, 269 (1997)).

In addition, as for organic thin film transistor (TFT) elements, a wide variety of low molecular-weight or polymer materials have been reported. For example, such materials have been investigated as low molecular-weight materials like pentacene, phthalocyanine, fullerene, anthradithiophene, thiophene oligomers and bisdithienothiophene or polymer materials like polythiophene, polythienylenevinylene and polymers containing arylamine as a repeated unit (see JP-A No. 2005-240001).

Furthermore, polymer materials having a fluorene structure have been actively investigated (see WO 00/46321, JP-A No. 2004-339206, and Macromolecules 32, 3306 (1999)).

Although the development of polymer materials in the art has significantly enhanced their hole mobility, which being a specific property for organic electronics materials, still higher mobility is required in order to apply the polymer materials to organic FET elements in particular.

In addition, the polymer materials are necessary to be sufficiently soluble into organic solvents in order to introduce greatest advantages of the organic materials, such as inexpensive production cost, sufficient flexibility and strength, lightweight, and possibility of larger area, into electronics elements. Pi-conjugated polymers, having a specific structure of stretched conjugate, typically exhibit a rigid structure, which causes lower solubility in general. The polymer materials in the art described above are mostly difficult to be dissolved, thus various molecular designs have been tried so as to avoid the insolubility.

BRIEF SUMMARY OF THE INVENTION

The present invention has been made in light of the current problems in the art, and aims to provide a pi-conjugated polymer material that is useful for photoelectric transducer elements having high hole transportability and excellent durability, that is useful for light-emitting elements having superior emitting properties and excellent durability, and that is useful for active layers of thin film transistors.

The present inventors have investigated vigorously and found that the problems described above may be solved by use of a pi-conjugated polymer having a specific constitutional unit.

That is, the problems described above may be solved by the invention and the related embodiments of (i) to (vi) below.

(i) In an aspect, the present invention is a pi-conjugated polymer having a constitutional unit expressed by the General Formula (I) below:

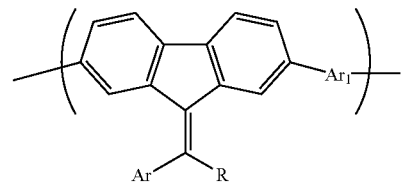

General Formula (I)

in the Formula (I), Ar represents an aromatic hydrocarbon group or a heterocyclic group that may have a substituent; R represents a hydrogen atom, an alkyl group or an aromatic hydrocarbon group that may have a substituent; $Ar_1$ represents a divalent group of an aromatic hydrocarbon or a heterocycle that may have a substituent.

(ii) In another aspect, the present invention is a pi-conjugated polymer having a constitutional unit expressed by the General Formula (II) below:

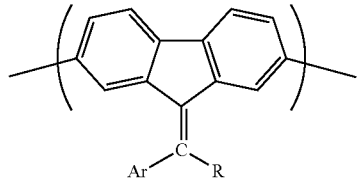

General Formula (II)

in the Formula (II), Ar represents an aromatic hydrocarbon group or a heterocyclic group that may have a substituent; R represents a hydrogen atom, an alkyl group or an aromatic hydrocarbon group that may have a substituent.

(iii) Preferably, Ar in the General Formula (I) or (II) is an aromatic hydrocarbon group expressed by the formula below:

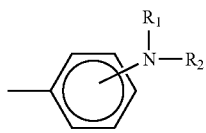

in the formula above, $R_1$ and $R_2$ are an alkyl group, an aromatic hydrocarbon group or a heterocyclic group that may have a substituent.

(iv) Preferably, Ar in the General Formula (I) or (II) is a heterocyclic group expressed by the formula below:

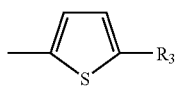

in the formula above, $R_3$ is a hydrogen atom, an alkyl group or an alkoxy group that may have a substituent.

(v) Preferably, Ar in the General Formula (I) or (II) is an aromatic hydrocarbon group expressed by the formula below:

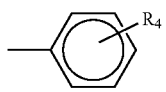

in the formula above, $R_4$ represents a hydrogen atom, a halogen atom, an alkyl group or an alkoxy group that may have a substituent.

(vi) Preferably, Ar in the General Formula (I) or (II) is a heterocyclic group expressed by the formula below:

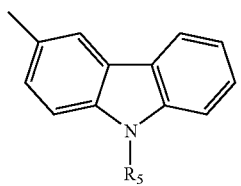

in the formula above, $R_5$ represents an alkyl group, an aromatic hydrocarbon group or a heterocyclic group that may have a substituent.

The present invention provides novel pi-conjugated polymers. The pi-conjugated polymers have repeated structural units of allylidenefluorene structure substituted by an aryl group (Ar) and allylene structure ($Ar_1$), therefore, can exhibit excellent charge or hole carrier mobility and provide film-forming ability typical for polymer materials, thus are valuable for various organic electronics materials such as photoelectric transducer elements, thin-film transistor elements, light-emitting elements etc.

DETAILED DESCRIPTION OF THE INVENTION

Figure 1:
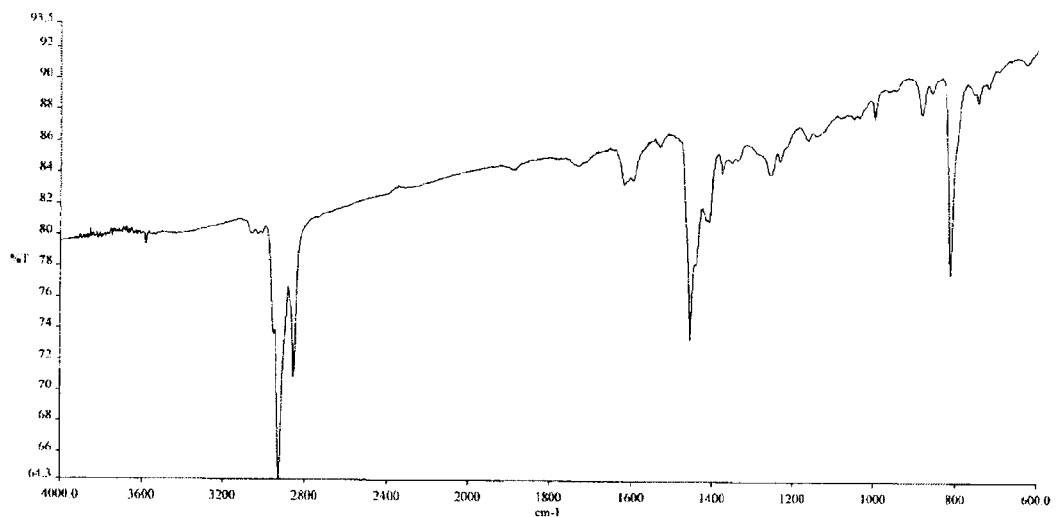
FIG. 1 shows an infrared absorption spectrum of the inventive polymer prepared in Example 1 (NaCl cast film).

The present invention will be explained more specifically in the following.

The pi-conjugated polymer expressed by the General Formula (I) may be prepared by the processes described below, but not limited to.

The pi-conjugated polymer expressed by the General Formula (I) may be prepared through polymerization reaction of a halogenated allylidenefluorene derivative expressed by the General Formula (III) and a boronic acid derivative expressed by the General Formula (IV).

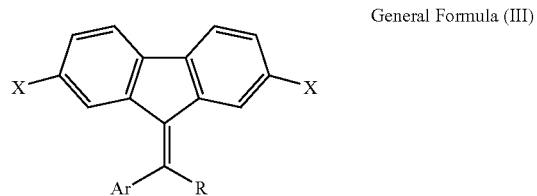

General Formula (III)

in the formula above, X represents a chlorine, bromine or iodine atom; R represents a hydrogen atom, an alkyl group or an aromatic hydrocarbon group that may have a substituent; Ar represents an aromatic hydrocarbon group or a heterocyclic group that may have a substituent.

$$Y—Ar_1—Y \quad \text{General Formula (IV)}$$

in the formula above, $Ar_1$ represents a divalent group of an aromatic hydrocarbon group or a heterocyclic group that may have a substituent; Y represents a boronic acid or an ester thereof.

The halogenated allylidenefluorene derivatives, expressed by the General Formula (III), are described in detail for their production processes in JP-A No. 2002-082483, which was filed by this applicant.

Production Example of
2,7-dibromo-9-fluorenylphosphatediethyl (Production Example A of Dibromo Compound)

A synthesis of a raw compound for producing a monomer of halogenated allylidenefluorene derivative expressed by the General Formula (III) will be explained in the following.

Triethyl phosphite of 50 ml was heated to 140° C. under nitrogen gas flow, to which added dropwise a solution of 30.63 g of 2,7,9-tribromofluorene in 100 ml of hot ortho-xylene. The reactant was heated at 153° C. to 159° C. for 30 minutes with stirring while distilling away resulting ethylbromide and ortho-xylene. The reactant was allowed to cool to room temperature, then excessive triethyl phosphite was removed under reduced pressure, thereby to prepare a product of light orange color.

The product was recrystallized from cyclohexane thereby to obtain 2,7-dibromo-9-fluorenylphosphonate diethyl (melting point: 119.0° C. to 119.5° C., colorless plate-like crystal) expressed by the Formula (F-1) below.

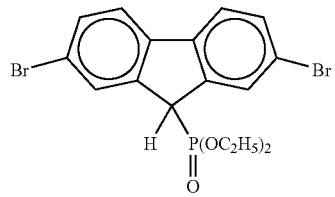

(F-1)

MONOMER PRODUCTION EXAMPLE 1

5.67 g of 2,7-dibromo-9-fluorenylphosphonate diethyl, obtained in Monomer Production Example A, and 5.20 g of 4-(2-ethylhexyloxy)-4'-formyltriphenylamine were dissolved into 30 ml of anhydrous THF to prepare a reactant solution. Then 3.47 g of a solution of 28% sodium methylate in methanol was added dropwise into the reactant solution. The mixture was heated for one hour under reflux then allowed to cool to room temperature, then the mixture was neutralized using acetic acid and poured into water. The resulting mixture was extracted into toluene, the resulting organic layer was rinsed with deionized water and dried over magnesium sulfate, then the solvent was distilled away under reduced pressure. The resulting product was subjected to silica gel chromatography (eluent: toluene/hexane=½ by volume), thereby to prepare a fluorene derivative, expressed by the formula below, of orange-red glassy substance in an amount of 5.60 g.

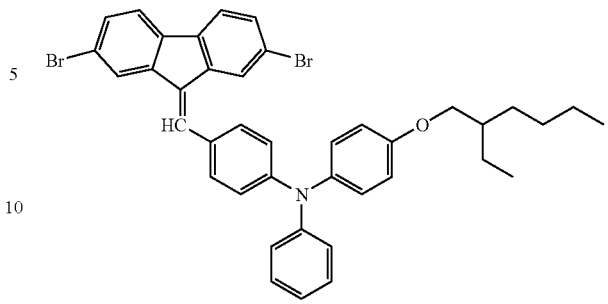

From the analyses of the resulting substance, the melting point was measured to be 93.0° C. to 93.5° C.; the elemental contents (%) of measured and (calculated) were C, 68.41; (67.90), H, 5.33; (5.27), Br, 21.96; (22.59), and N, 1.76; (1.98).

MONOMER PRODUCTION EXAMPLE 2

Yellow needle-like crystal of 2,7-dibromo-9-(4-n-tetradecyloxy benzylidene)fluorene, expressed by the formula below, was prepared in the same manner as Monomer Production Example 1 except that 4-n-tetradecyloxybenzaldehyde was used in place of 4-(2-ethylhexyloxy)-4'-formyltriphenylamine.

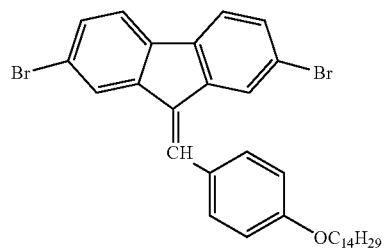

From the analyses of the resulting substance, the melting point was measured to be 96.5° C. to 97.0° C.; the elemental contents (%) of measured and (calculated) were C, 65.44 (65.39); H, 6.46 (6.46); Br, 26.13 (25.59).

MONOMER PRODUCTION EXAMPLE 3

2,7-dibromo-9-(beta-methylcinnamylidene)fluorene, expressed by the formula below, was prepared in the same manner as Monomer Production Example 1 except that alpha-methyl-trans-cinnamaldehyde was used in place of 4-(2-ethylhexyloxy)-4'-formyltriphenylamine.

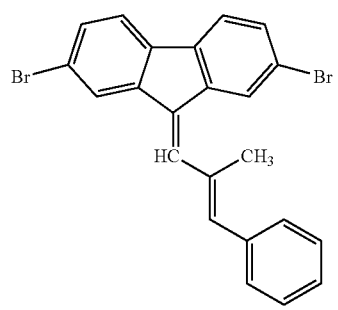

From the analyses of the resulting substance, the melting point was measured to be 132.0° C. to 132.5° C.; the elemental contents (%) of measured and (calculated) were C, 61.11 (61.09); H, 3.61 (3.57); Br, 35.16 (35.34).

MONOMER PRODUCTION EXAMPLE 4

2,7-dibromo-9-benzylidenefluorene was prepared in the same manner as Monomer Production Example 1 except that benzaldehyde was used in place of 4-(2-ethylhexyloxy)-4'-formyltriphenylamine.

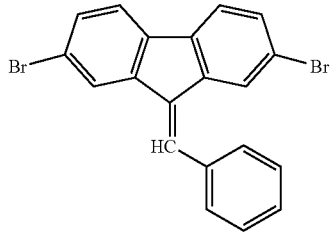

From the analyses of the resulting substance, the melting point was measured to be 100.0° C. to 102.0° C.; the elemental contents (%) of measured and (calculated) were C, 58.26 (58.29); H, 3.01 (2.93); Br, 38.97 (38.78).

MONOMER PRODUCTION EXAMPLE 5

6.48 g of 2,7-dibromofluorene was dissolved into 50 ml of anhydrous THF, to which 7.71 g of a solution of 28% sodium methylate in methanol was added dropwise in nitrogen gas flow and the resulting solution was stirred for 30 minutes at room temperature, to which then a solution containing 7.49 g of 4-n-octadecyloxybenzaldehyde in THF 20 ml was added dropwise. After heating the reactant for 30 minutes under reflux, the reactant was poured into water and neutralized using HCl, then the precipitate was filtered and rinsed with deionized water. The resulting solid was recrystallized from a mixture solvent of ethanol/ethylacetate thereby to prepare 10.0 g of 2,7-dibromo-9-(4-octadecyloxybenzylidene)fluorene, expressed by the formula below.

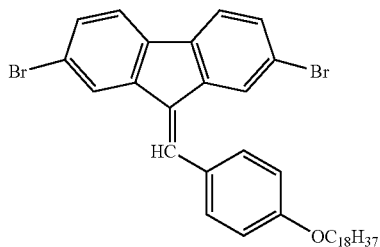

From the analyses of the resulting substance, the melting point was measured to be 101.5° C. to 102.0° C.; the elemental contents (%) of measured and (calculated) were C, 67.09 (67.06); H, 7.18 (7.11) Br, 22.89 (23.48).

MONOMER PRODUCTION EXAMPLE 6

2,7-dibromo-9-(4-diethylaminobenzylidene)fluorene, expressed by the formula below, was prepared in the same manner as Monomer Production Example 5 except that 4-diethylaminobenzaldehyde was used in place of 4-n-octadecyloxybenzaldehyde.

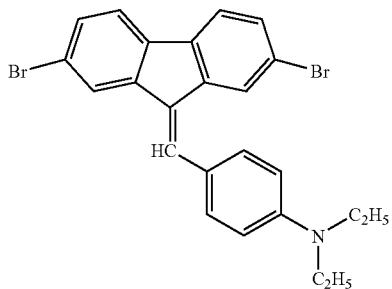

From the analyses of the resulting substance, the melting point was measured to be 178.0° C. to 178.5° C.; the elemental contents (%) of measured and (calculated) were C, 59.68 (59.65); H, 4.46 (4.38); Br, 32.59 (33.07); N, 2.81 (2.90).

MONOMER PRODUCTION EXAMPLE 7

2,7-dibromo-9-(3,4-dioctyloxybenzylidene)fluorene, expressed by the formula below, was prepared in the same manner as Monomer Production Example 5 except that 4-dioctyloxybenzaldehyde was used in place of 4-n-octadecyloxybenzaldehyde.

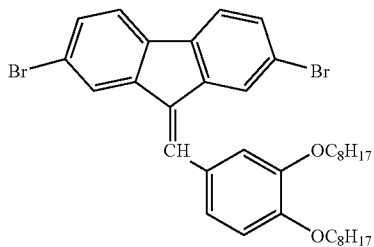

From the analyses of the resulting substance, the melting point was measured to be 73.0° C. to 74.0° C.; the elemental contents (%) of measured and (calculated) were C, 64.66 (64.68); H, 6.64 (6.63); Br, 24.45 (23.90).

MONOMER PRODUCTION EXAMPLE 8

2,7-dibromo-9-(N-ethylcarbazolidene-3)fluorene, expressed by the formula below, was prepared in the same manner as Monomer Production Example 5 except that N-ethylcarbazole-3-aldehyde was used in place of 4-n-octadecyloxybenzaldehyde.

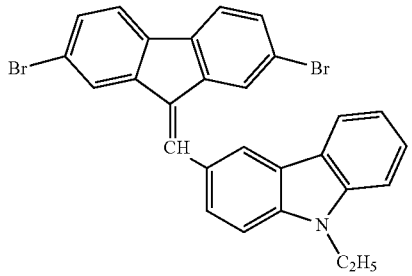

From the analyses of the resulting substance, the melting point was measured to be 181.0° C. to 182.0° C.; the elemental contents (%) of measured and (calculated) were C, 63.61 (63.54); H, 3.66 (3.62); Br, 30.27 (30.19); N, 2.66 (2.65).

MONOMER PRODUCTION EXAMPLE 9

2,7-dibromo-9-(cinnamylidene)fluorene, expressed by the formula below, was prepared in the same manner as Monomer Production Example 5 except that trans-cinnamaldehyde was used in place of 4-n-octadecyloxybenzaldehyde.

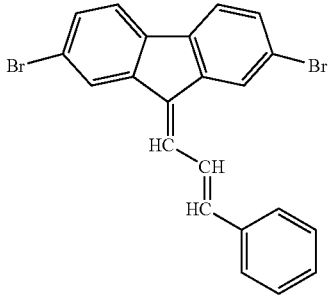

From the analyses of the resulting substance, the melting point was measured to be 213.0° C. to 213.5° C.; the elemental contents (%) of measured and (calculated) were C, 60.35 (60.31); H, 3.26 (3.22); Br, 36.49 (36.47).

MONOMER PRODUCTION EXAMPLE 10

2,7-dibromo-9-(alpha-methylbenzylidene)fluorene, expressed by the formula below, was prepared in the same manner as Monomer Production Example 5 except that acetophenone was used in place of 4-n-octadecyloxybenzaldehyde.

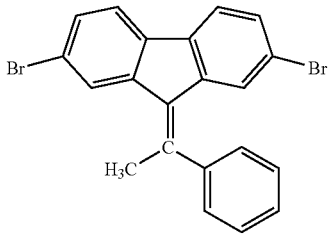

From the analyses of the resulting substance, the melting point was measured to be 133.0° C. (sintering at 102° C.); the elemental contents (%) of measured and (calculated) were C, 59.16 (59.19); H, 3.37 (3.31); Br, 38.03 (37.50).

MONOMER PRODUCTION EXAMPLE 11

2,7-dibromo-9-(3,5-ditrifluoromethylbenzylidene)fluorene, expressed by the formula below, was prepared in the same manner as Monomer Production Example 5 except that 3,5-ditrifluoromethylbenzaldehyde was used in place of 4-n-octadecyloxybenzaldehyde.

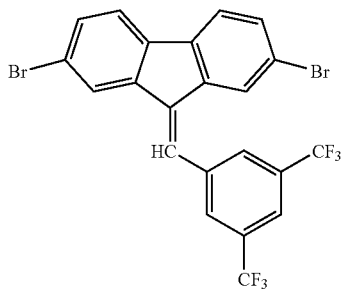

From the analyses of the resulting substance, the melting point was measured to be 176.5° C. to 177.0° C.; the elemental contents (%) of measured and (calculated) were C, 48.17 (48.21); H, 1.92 (1.84); Br, 28.68 (29.16).

MONOMER PRODUCTION EXAMPLE 12

2,7-dibromo-9-(4-butylbenzylidene)fluorene, expressed by the formula below, was prepared in the same manner as Monomer Production Example 5 except that 4-butylbenzaldehyde was used in place of 4-n-octadecyloxybenzaldehyde.

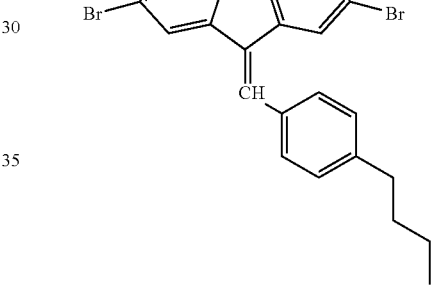

From the analyses of the resulting substance, the melting point was measured to be 80.5° C. to 82.0° C.; the elemental contents (%) of measured and (calculated) were C, 61.50 (61.56); H, 4.34 (4.31); Br, 34.97 (34.13).

MONOMER PRODUCTION EXAMPLE 13

2,7-dibromo-9-(4-diethylaminocinnamylidene)fluorene, expressed by the formula below, was prepared in the same manner as Monomer Production Example 5 except that 4-diethylamino-trans-cinnamaldehyde was used in place of 4-n-octadecyloxybenzaldehyde.

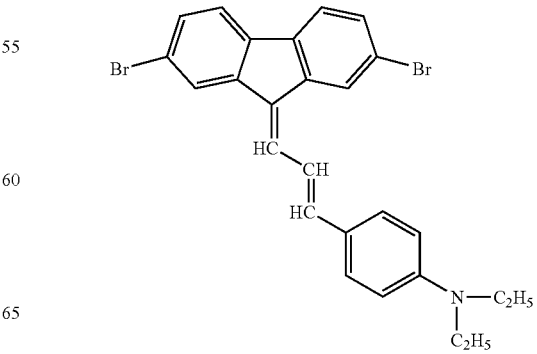

MONOMER PRODUCTION EXAMPLE 14

2,7-dibromo-9-(N-2-ethylhexylcarbazolidene-3)fluorene, expressed by the formula below, was prepared in the same manner as Monomer Production Example 5 except that N-2-ethylhexylcarbazole-3-aldehyde was used in place of 4-n-octadecyloxybenzaldehyde.

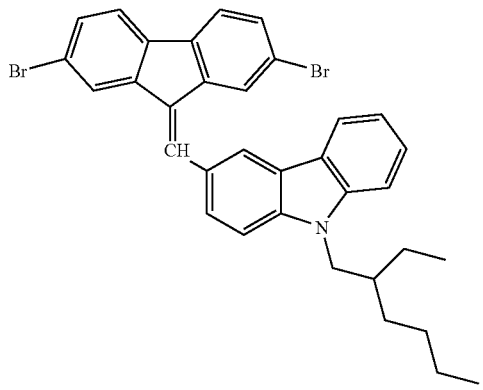

From the analyses of the resulting substance, the melting point was measured to be glassy; the elemental contents (%) of measured and (calculated) were C, 66.67 (66.57); H, 5.17 (5.09); Br, 25.44 (26.05); N, 2.07 (2.28).

MONOMER PRODUCTION EXAMPLE 15

4.18 g of 2,7-diiodofluorene was weighed and dissolved into 50 ml of anhydrous THF at 40° C., to which 3.90 g of a solution of 28% sodium methylate in methanol was added dropwise under nitrogen gas flow. The resulting solution was stirred for 30 minutes at room temperature, to which then a solution containing 3.50 g of 4-n-tetradecyloxybenzaldehyde in THF 50 ml was added dropwise. After heating the solution for 10 minutes under reflux and stirring for 50 minutes at room temperature, the solution was poured into water and neutralized using HCl, then the precipitate was filtered and rinsed with deionized water. The resulting solid was recrystallized from a mixture solvent of ethanol/toluene, subjected to silica gel chromatography (eluent: toluene/hexane=½ by volume), then further recrystallized from a mixture solvent of ethanol/toluene, thereby to prepare yellow needle-like crystal of 2,7-diiodo-9-(4-tetradecyloxybenzylidene)fluorene expressed by the formula below in an amount of 5.20 g.

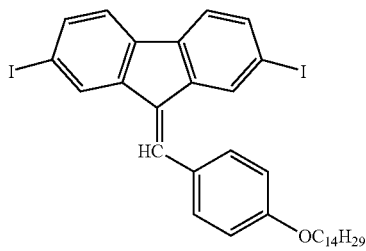

From the analyses of the resulting substance, the melting point was measured to be 98.5° C. to 99.0° C.; the elemental contents (%) of measured and (calculated) were C, 56.81 (56.84); H, 5.62 (5.61); I, 35.10 (35.33).

The polymerization reaction between halogenated allylidenefluorene derivatives, expressed by the General Formula (III), and boronic acid derivatives, expressed by the General Formula (IV), is exemplified by Suzuki-Miyaura reaction, which is known as cross-coupling reaction between aryl boron compounds and organic halides by use of palladium catalysts (Miyaura, N. Suzuki, A. Chem. Rev. 95, 2457 (1995)).

The halogen atom of halogenated allylidenefluorene derivatives, expressed by the General Formula (III), is preferably iodine or bromine in view of reactivity.

The boronic acid derivatives, expressed by the General Formula (IV), may be, in addition to aryl boronic acids, aryl boronic esters that can be synthesized from bis(pinacolat) diboron compounds, of being thermally stable and capable of handling in air, and halogenated aryl compounds.

The palladium catalysts may be $Pd(PPh_3)_4$, $PdCl_2(PPh_3)_2$, $Pd(OAc)_2$, $PdCl_2$, etc., usually, $Pd(PPh_3)_4$ is employed.

A base is inevitably necessary in the reaction, and weak bases such as $Na_2CO_3$ and $NaHCO_3$ may be favorable. In cases where steric hindrance is to be considered, strong bases such as $Ba(OH)_2$ and $K_3PO_4$ may be favorable. Other bases may also be available, for example, sodium hydroxide, potassium hydroxide, metal alkoxide such as potassium t-butoxide, sodium t-butoxide, lithium t-butoxide, potassium-2-methyl-2-butoxide, sodium-2-methyl-2-butoxide, sodium methoxide, sodium ethoxide, potassium ethoxide, and potassium methoxide. In addition, organic bases such as triethylamine may be available.

The reaction solvent may be alcohols such as methanol, ethanol, isopropanol, butanol and 2-methoxyethanol; ethers such as 1,2-dimethoxyethane and bis(2-methoxyethyl)ether; cyclic ethers such as dioxane and tetrahydrofuran; benzene, toluene, xylene, dimethylsulfoxide, N,N-dimethylformamide, N-methylpyrrolidone, 1,3-dimethyl-2-imidazolidine.

The polymerization reaction between the halogenated allylidenefluorene derivatives, expressed by the General Formula (III), and boronic acid derivatives, expressed by the General Formula (IV), is designed with respect to temperature, period, concentration, etc. of the reaction depending on their reactivity.

In the polymerization process, a molecular-weight controller for controlling the molecular weight of resulting polymer or a blocking agent for blocking polymer ends as an end-modifying group may be added to the reactant before, during or after the reaction. As such, the ends of inventive pi-conjugated polymer may have a substituent derived from the blocking agent.

The number average molecular weight of the inventive pi-conjugated polymer is preferably 1,000 to 1,000,000, more preferably 2,000 to 500,000 on a polystyrene conversion. Excessively low molecular weights may degrade film-forming ability, e.g. occurrence of cracks, resulting in poor practical utility; excessively high molecular weights may lower solubility in usual organic solvents, and lead to higher solution viscosity and troublesome coating, resulting also in poor practical utility.

The pi-conjugated polymer produced as describes above is purified, before its usage, by removing the polymerization catalysts, unreacted monomers, end-blocking agents, and by-products like ammonium salts. Specifically, these impurities may be removed by conventional processes such as reprecipitation, column chromatography, absorption, extraction, Soxhlet extraction, ultrafiltration, dialysis, scavengers for removing catalysts, etc.

The inventive pi-conjugated polymer may be formed into superior thin films, being excellent in crack-less, strength, toughness, durability, and the like, by way of spin coating, casting, dipping, ink-jet, doctor blade, or screen printing process, thus may be utilized for a wide variety of function elements such as photoelectric transducer elements, thin-film transistor elements, light-emitting elements.

Specific examples of the inventive pi-conjugated polymers, expressed by the General Formulas (I) and (II), are shown in the following.

$Ar_1$ in the General Formula (I) may be a divalent group derived from benzene, naphthalene, biphenyl, terphenyl, pyrene, fluorene, 9,9-dimethylfluorene, azulene, anthracene, triphenylene, chrysene, 9-benzylidene fluorene, 5H-dibenzo [a,d]cyclohepten, [2,2]-paracyclophane, triphenylamine, thiophene, benzothiophene, dithienylbenzene, furan, benzofuran, carbazole, etc.; these divalent groups may have an alkyl and/or alkoxy group as a substituent that may further have a substituent.

Alkyl groups, which may have a substituent, are exemplified by linear, branched, or cyclic alkyl groups having a carbon number of 1 to 25, and these alkyl groups may further have a fluorine atom, a cyano group, a phenyl group, or a phenyl group substituted with halogen atoms, linear or branched alkyl groups.

Specific examples of alkyl groups, which may have a substituent, include methyl, ethyl, n-propyl, i-propyl, t-butyl, s-butyl, n-butyl, i-butyl, pentyl, hexyl, heptyl, octyl, nonyl, decyl, 3,7-dimethyloctyl, 2-ethylhexyl, trifluoromethyl, 2-cyanoethyl, benzyl, 4-chlorobenzyl, 4-methylbenzyl, cyclopentyl, cyclohexyl, and the like.

Specific examples of the alkoxy groups, which may have a substituent, are the above-noted alkyl groups having an oxygen atom at the bonding site thereof.

In cases where Ar in General Formulas (I) and (II), and R, $R_1$, $R_2$, $R_3$, $R_4$, and $R_5$ each represent an aromatic hydrocarbon group, these groups may be a monovalent group of aromatic hydrocarbon groups and heterocyclic groups discussed above in relation to $Ar_1$. In cases where R, $R_1$, $R_2$, $R_3$, $R_4$, and $R_5$ each represent an aromatic hydrocarbon group, the group is preferably a phenyl group that may have a substituent. In cases where R, $R_1$, $R_2$, $R_3$, $R_4$, and $R_5$ in the General Formulas (I) and (II) each represent an alkyl group that may have a substituent, these groups may be selected from those discussed above in relation to aromatic hydrocarbon groups or heterocyclic groups.

Preferable examples of the boronic acid derivatives, expressed by General Formula (IV), are shown below.

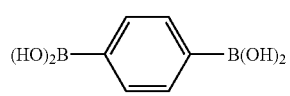
(IV)-1

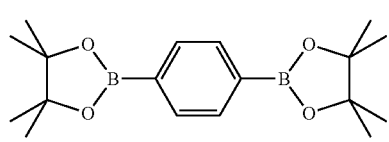
(IV)-2

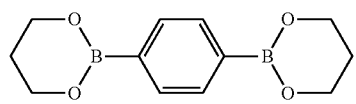
(IV)-3

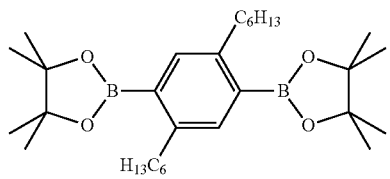
(IV)-4

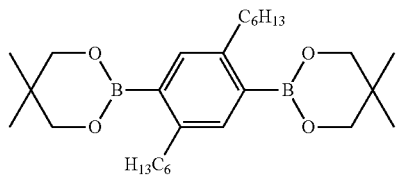
(IV)-5

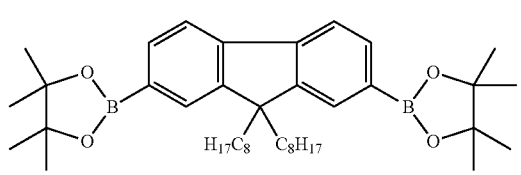
(IV)-6

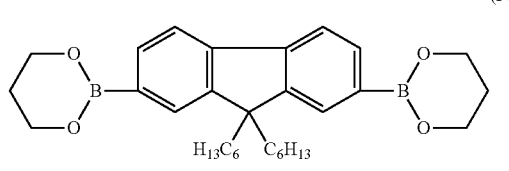
(IV)-7

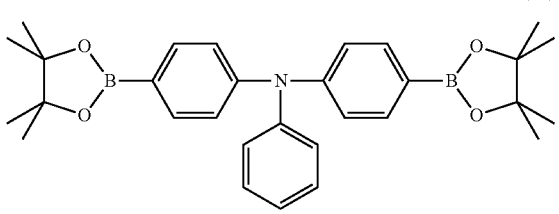
(IV)-8

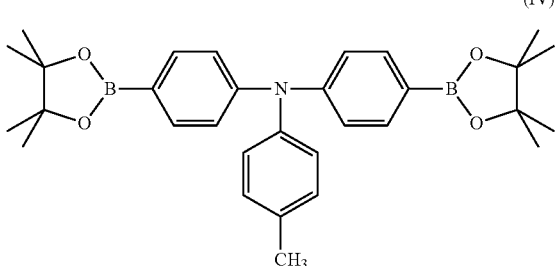
(IV)-9

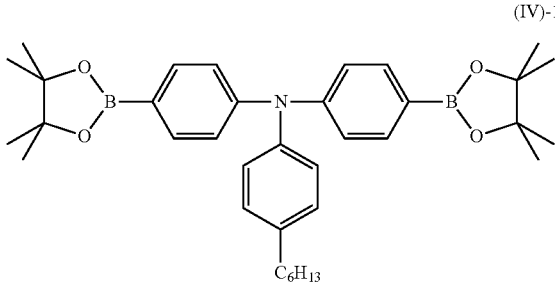
(IV)-10

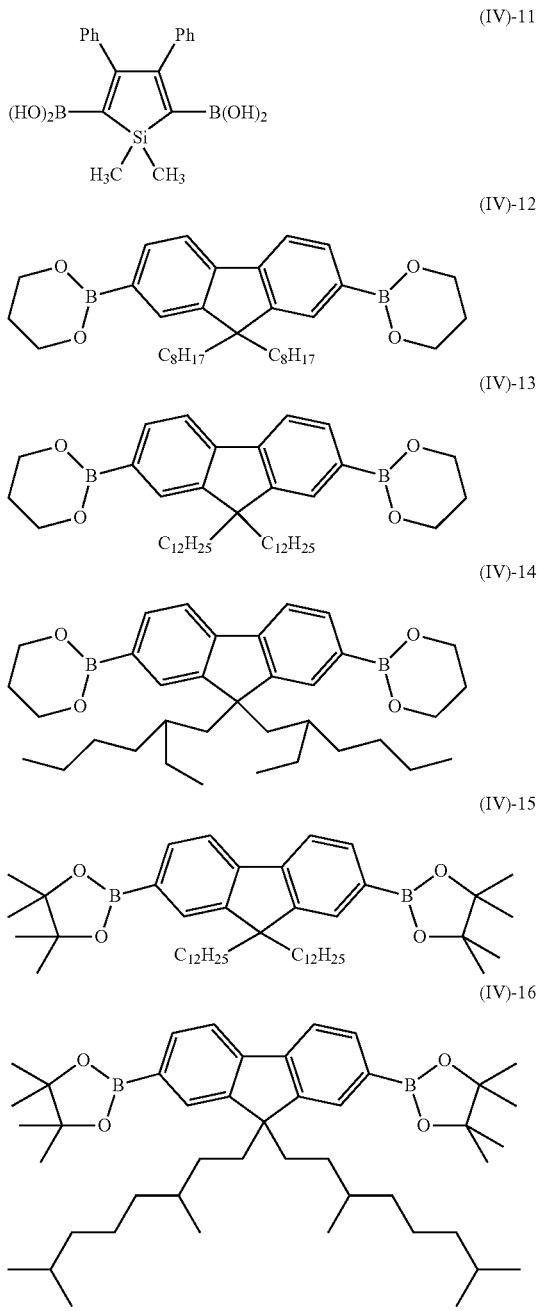

For example, those of (IV)-8, (IV)-9, and (IV)-10 may be synthesized by the process described in JP-A No. 2005-249285; the other boronic acid compounds may be commercially available from Aldrich Co. etc.

The inventive pi-conjugated polymers may present higher solubility in solvents by virtue of alkyl, alkoxy, or alkylthio groups. Such higher solubility of the polymers is important and valuable since allowable margin in wet film-forming processes may be expanded when photoelectric transducer elements, thin-film transistor elements, light-emitting elements, etc. being produced. More specifically, selectability of coating solvents, temperature ranges at preparing solutions, and temperatures or pressures at drying solvents may be expanded or broadened, thus the feasible processability may result in high-quality thin films with high purity and superior uniformity.

EXAMPLES

The present invention will be explained more specifically with reference to examples, but the present invention is to be limited in no way to these examples as long as being within the inventive gist.

Example 1

A total of 0.432 g (1.0 mmol) of the dibromo compound expressed by the Formula (I) below, 0.643 g (1.0 mmol) of the diboronic ester expressed by the Formula (2) below, 12 mg (0.01 mmol) of tetrakis triphenylphosphine palladium, and 0.16 ml of tricaprylmethylammonium chloride (Aliquat 336) were added to 8 ml of toluene, to which 9 ml of 1M aqueous sodium carbonate solution was added, then the mixture was heated under reflux for 6 hours in nitrogen gas flow. A few droplets of bromobenzene were added to the resulting reactant and the mixture was heated under reflux for 1 hour, followed by adding a few droplets of phenyl boronic acid and heating under reflux for 1 hour, then the reactant was allowed to cool to room temperature. The reaction product was diluted with toluene, the resultant toluene layer was separated and rinsed with 5% aqueous HCl solution, then repeatedly rinsed with deionized water till the conductivities of deionized water came to equivalent between after and before the rinsing. Toluene was distilled away from the reaction product, which was then dissolved in tetrahydrofuran (THF), thereafter the solution was dripped into methanol, the resultant polymer was taken by filtration and dried with heating, thereby to prepare inventive yellow polymer No. 1 expressed by the formula below in an amount of 0.36 g.

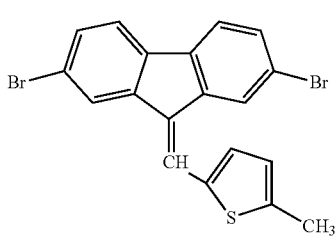

Formula (1)

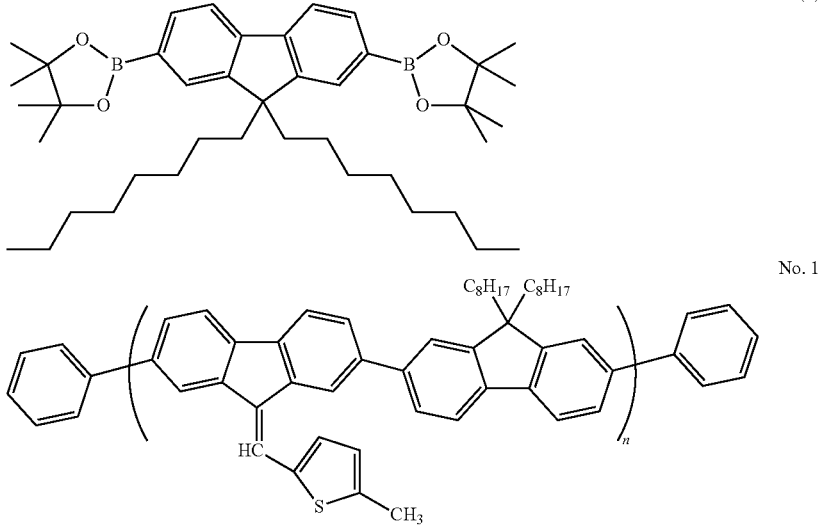

Formula (2)

No. 1

From the analyses of the resulting substance, the elemental contents (%) of measured and (calculated) were C, 87.53 (87.20); H, 7.55 (7.94); S, 4.66 (4.85).

The infrared absorption spectrum (NaCl cast film) is shown in FIG. 1. Gel permeation chromatography revealed the polystyrene-equivalent molecular weight as 6,436 of number average molecular weight and 19,554 of weight average molecular weight.

Example 2

A total of 0.548 g (0.92 mmol) of the dibromo compound expressed by the Formula (3) below, 0.591 g (0.92 mmol) of the diboronic ester expressed by the Formula (2) described above in Example 1, 11 mg (0.01 mmol) of tetrakis triphenylphosphine palladium, and 0.16 ml of tricaprylmethylammonium chloride (Aliquat 336) were added to 8 ml of toluene, to which 9 ml of 1M aqueous sodium carbonate solution was added, then the mixture was heated under reflux for 12 hours in nitrogen gas flow. The reactant was end-treated in the same manner as Example 1, then was diluted with toluene, the resulting toluene layer was separated, water-rinsed, and filtered after adding 40 mg of a palladium scavenger (silica gel modified with 3-mercaptopropyl group). The resulting filter cake was rinsed with 5% aqueous HCl solution then with deionized water to prepare a reaction product. After the toluene solution was condensed, it was poured dropwise into methanol to prepare a yellow polymer. The resulting polymer was dissolved in methylene chloride, and the solution was treated with a short column (silica gel and minor Florisil) and then dripped into methanol; the resulting precipitate was taken by filtration and dried thereby to prepare an inventive polymer No. 2 expressed by the formula below in an amount of 0.56 g.

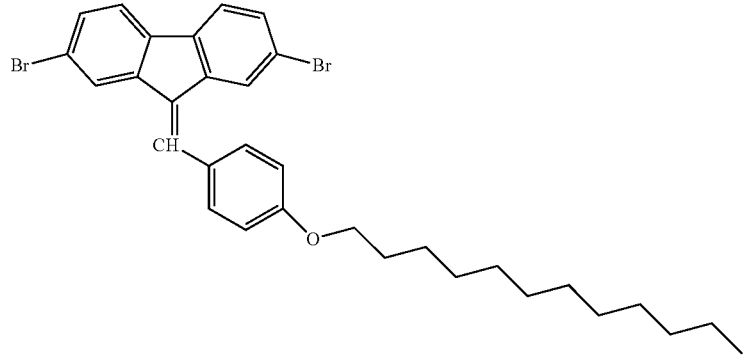

Formula (3)

-continued

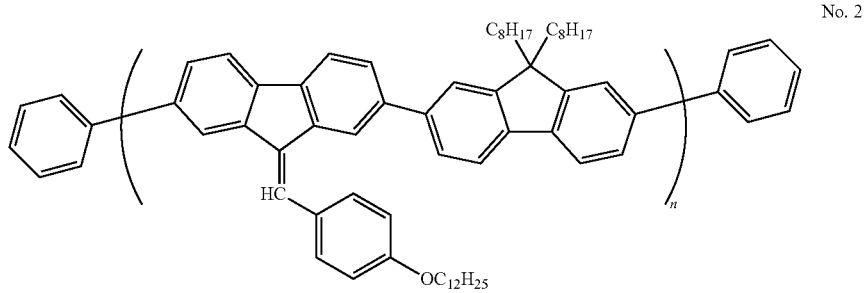

No. 2

From the analyses of the resulting substance, the elemental contents (%) of measured and (calculated) were C, 87.39 (88.76); H, 9.42 (9.30).

Figure 2:
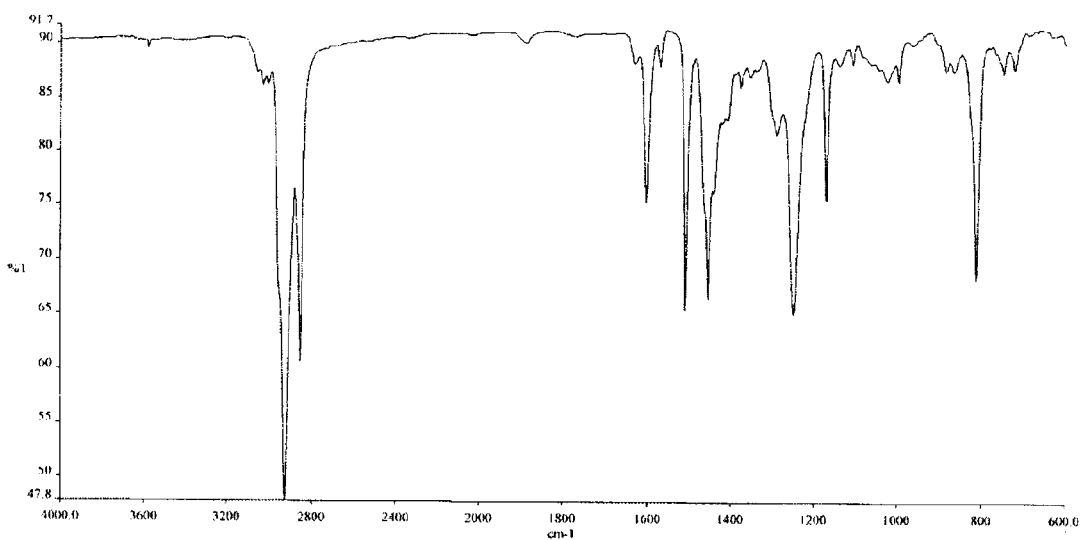
FIG. 2 shows an infrared absorption spectrum of the inventive polymer prepared in Example 2 (NaCl cast film).

The infrared absorption spectrum (NaCl cast film) is shown in FIG. 2. Gel permeation chromatography revealed the polystyrene-equivalent molecular weight as 9,056 of number average molecular weight and 21,402 of weight average molecular weight.

Example 3

A total of 0.400 g (0.76 mmol) of the dibromo compound expressed by the Formula (4) below, 0.488 g (0.76 mmol) of the diboronic ester expressed by the Formula (2) described above, and 0.16 ml of tricaprylmethylammonium chloride (Aliquat 336) were added to 8 ml of toluene, to which 4 ml of 2M aqueous sodium carbonate solution was added, then the mixture was stirred for 30 minutes in nitrogen gas flow, to which 9.1 mg ($0.79 \times 10^{-2}$ mmol) of tetrakis triphenylphosphine palladium was added, then the mixture was heated under reflux for 15 hours. A few droplets of bromobenzene were added to the resulting reactant and the mixture was heated under reflux for 3 hour, followed by adding a few droplets of phenyl boronic acid and heating under reflux for 3 hours, then the reactant was allowed to cool to room temperature. The reactant was diluted with toluene, the resulting toluene layer was separated, water-rinsed, and treated with a palladium scavenger (silica gel modified with 3-mercaptopropyl group), then treated with a silica gel short column, followed by condensing and dripping into ethanol; the resulting precipitate was taken by filtration and dried thereby to prepare an inventive polymer No. 3 expressed by the formula below in an amount of 0.53 g.

Formula (4)

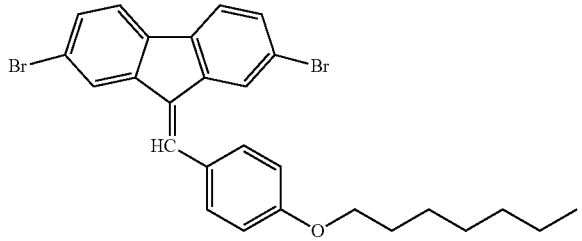

No. 3

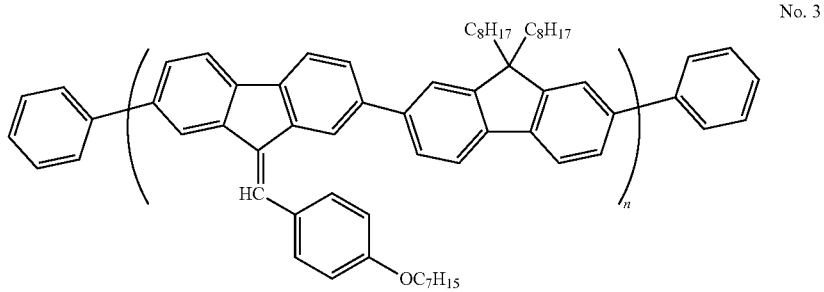

From the analyses of the resulting substance, the elemental contents (%) of measured and (calculated) were C, 88.10 (89.05); H, 8.93 (8.83); S, 4.66 (4.85).

Figure 3:
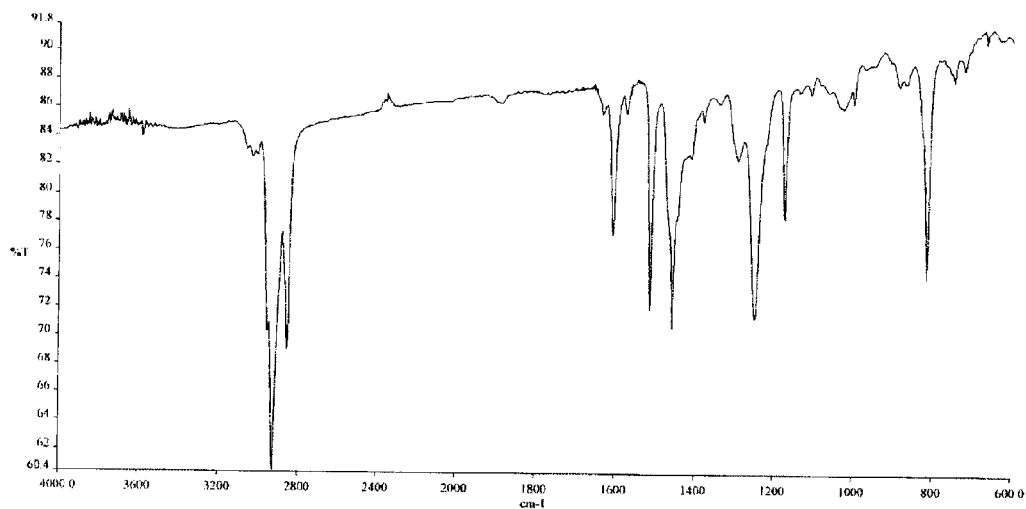
FIG. 3 shows an infrared absorption spectrum of the inventive polymer prepared in Example 3 (NaCl cast film).

The infrared absorption spectrum (NaCl cast film) is shown in FIG. 3. Gel permeation chromatography revealed the polystyrene-equivalent molecular weight as 11,346 of number average molecular weight and 29,965 of weight average molecular weight.

Example 4

A total of 0.607 g (1.0 mmol) of the dibromo compound expressed by the Formula (5) below, 0.642 g (1.0 mmol) of the diboronic ester expressed by the Formula (2), 12 mg (0.01 mmol) of tetrakis triphenylphosphine palladium, and 0.16 ml of tricaprylmethylammonium chloride (Aliquat 336) were added to 10 ml of toluene, to which 10 ml of 1M aqueous sodium carbonate solution was added, then the mixture was heated under reflux for 16 hours in nitrogen gas flow. The reactant was end-treated in the same manner as that of Example 1, then was diluted with toluene, the resulting toluene layer was separated, water-rinsed, and filtered after adding 40 mg of a palladium scavenger (silica gel modified with 3-mercaptopropyl group), then dripped into methanol thereby to prepare a yellow polymer. The resulting polymer was dissolved in toluene; and the toluene solution was treated with a short column of silica gel, then repeatedly rinsed with deionized water till the conductivities of deionized water came to equivalent between after and before the rinsing, thereafter dripped into ethanol; the resulting precipitate was taken by filtration and dried thereby to prepare an inventive polymer No. 4 expressed by the formula below in an amount of 0.80 g.

From the analyses of the resulting substance, the elemental contents (%) of measured and (calculated) were C, 88.35 (90.47); H, 7.89 (7.85); N, 1.66 (1.68).

Figure 4:
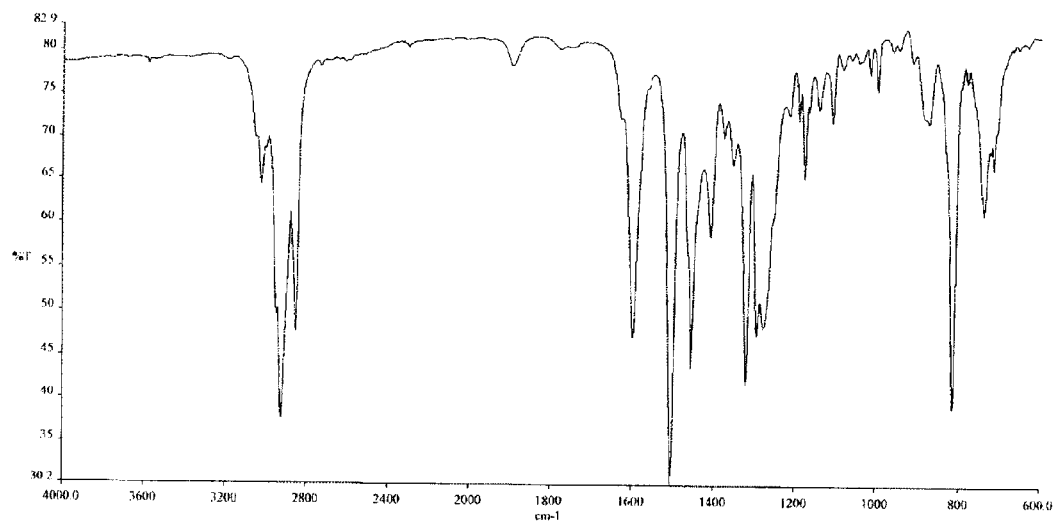
FIG. 4 shows an infrared absorption spectrum of the inventive polymer prepared in Example 4 (NaCl cast film).

The infrared absorption spectrum (NaCl cast film) is shown in FIG. 4. Gel permeation chromatography revealed the polystyrene-equivalent molecular weight as 4,704 of number average molecular weight and 14,994 of weight average molecular weight.

Example 5

A total of 0.607 g (1.0 mmol) of the dibromo compound expressed by the Formula (5) above, 0.498 g (1.0 mmol) of the diboronic ester expressed by the Formula (6) below, 12 mg (0.01 mmol) of tetrakis triphenylphosphine palladium, and 0.16 ml of tricaprylmethylammonium chloride (Aliquat 336) were added to 10 ml of toluene, to which 10 ml of 1M aqueous sodium carbonate solution was added, then the mixture was heated under reflux for 8 hours in nitrogen gas flow. The reactant was end-treated in the same manner as Example 1, then was diluted with toluene, the resulting toluene layer was separated, water-rinsed, and filtered after adding 40 mg of a palladium scavenger (silica gel modified with 3-mercaptopropyl group), then dripped into methanol thereby to prepare a yellow polymer. The resulting polymer was dissolved in toluene; and the toluene solution was treated with a short column of silica gel, then repeatedly rinsed with deionized water till the conductivities of deionized water came to equivalent between after and before the rinsing, thereafter dripped into ethanol; the resulting precipitate was taken by filtration and dried thereby to prepare an inventive polymer No. 5 expressed by the formula below in an amount of 0.55 g.

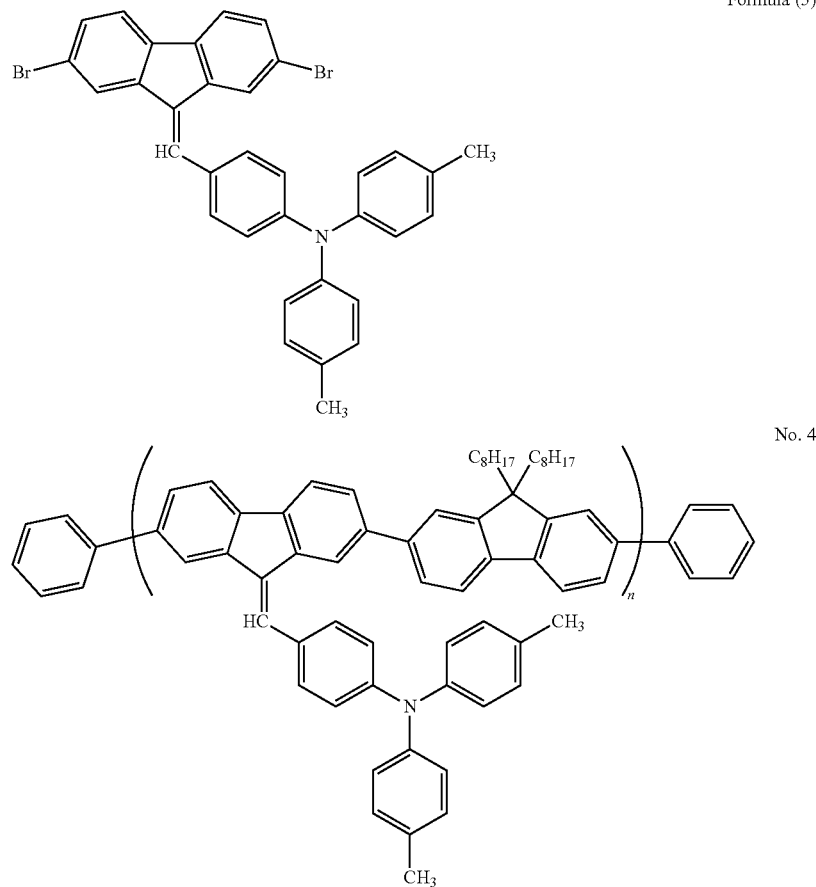

Formula (5)

No. 4

Formula (6)

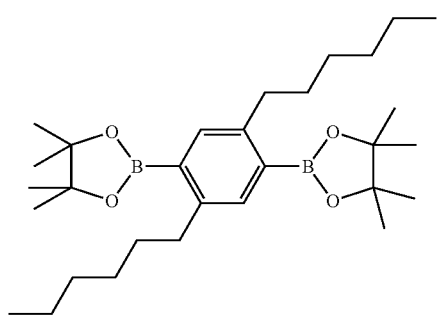

No. 5

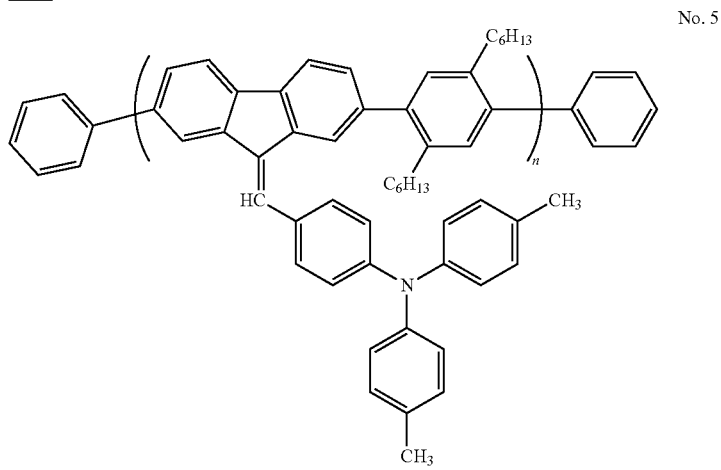

From the analyses of the resulting substance, the elemental contents (%) of measured and (calculated) were C, 88.85 (90.24); H, 7.45 (7.73); N, 2.07 (2.02).

Figure 5:
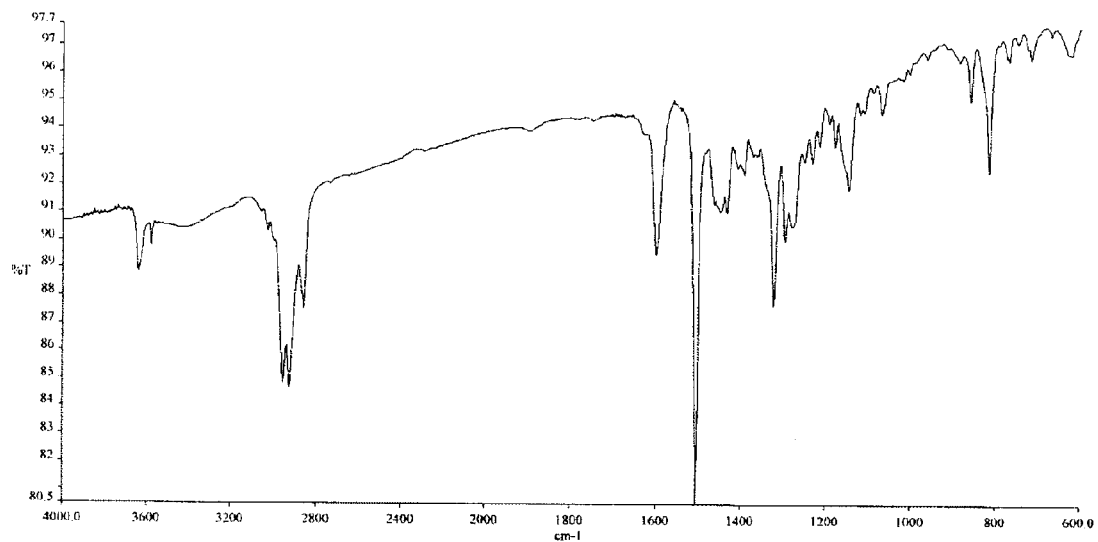
FIG. 5 shows an infrared absorption spectrum of the inventive polymer prepared in Example 5 (NaCl cast film).

The infrared absorption spectrum (NaCl cast film) is shown in FIG. 5. Gel permeation chromatography revealed the polystyrene-equivalent molecular weight as 1,200 of number average molecular weight and 2,150 of weight average molecular weight.

Example 6

A total of 3.122 g (5.0 mmol) of the dibromo compound obtained in Monomer Production Example 2 described above, 3.213 g (5.0 mmol) of the diboronic ester expressed by the Formula (2) in Example 1, and 45 mg (0.11 mmol) of a phase-transfer catalyst (Aliquat 336, by Aldrich Co.) were added to a three-neck flask of 200 ml, then the flask was filled with nitrogen gas, followed by adding 29 mg (0.025 mmol) of tetrakis triphenylphosphine palladium, 30 ml of nitrogen-bubbled toluene, and 13 ml of nitrogen-bubbled 2M aqueous sodium carbonate solution in order, then the mixture was heated for 14 hours under reflux in nitrogen gas flow. In order to cause termination reaction, 243 mg (2 mmol) of phenylboronic acid was added to the reactant, and the mixture was heated under reflux for 6 hours, then 0.262 ml (2.5 mmol) of bromobenzene was added and the mixture was similarly heated under reflux for 4 hours. Thereafter, the reactant solution was cooled to room temperature, the organic layer was diluted with toluene, the solution was dripped into a mixture solvent of methanol/water to cause reprecipitation, thereby to prepare a polymer. After heating to dry the polymer, tetrahydrofuran (THF) solution of the polymer was prepared, then the solution was dripped into methanol to prepare a polymer, then the polymer was taken by filtration, followed by heating and drying. The resulting polymer was dissolved into dichloromethane, then to which 1 g of a palladium scavenger (3-mercaptopropyl-functionalized silica gel, by Aldrich Co.) was added, the mixture was stirred for one hour at room temperature, then the scavenger was separated by filtration. Thereafter, the polymer solution was repeatedly rinsed with deionized water till the conductivities of deionized water came to equivalent between after and before the rinsing, then was dissolved into THF after distilling away the dichloromethane, and the solution was further dripped into methanol and the resulting polymer was taken by filtration and heated to dry thereby to prepare an inventive polymer No. 6 expressed by the formula below in an amount of 3.62 g.

No. 6

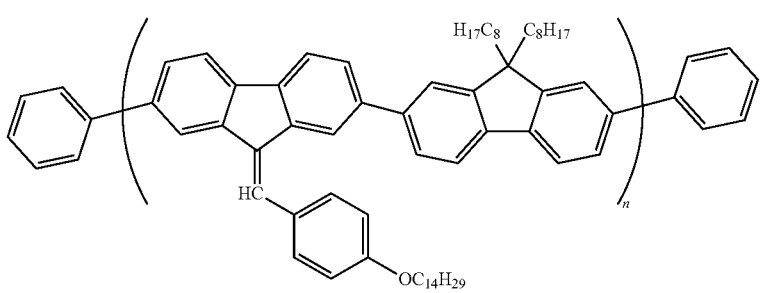

From the analyses of the resulting substance, the elemental contents (%) of measured and (calculated) were C, 88.40; (88.68), H, 9.38; (9.45).

Figure 6:
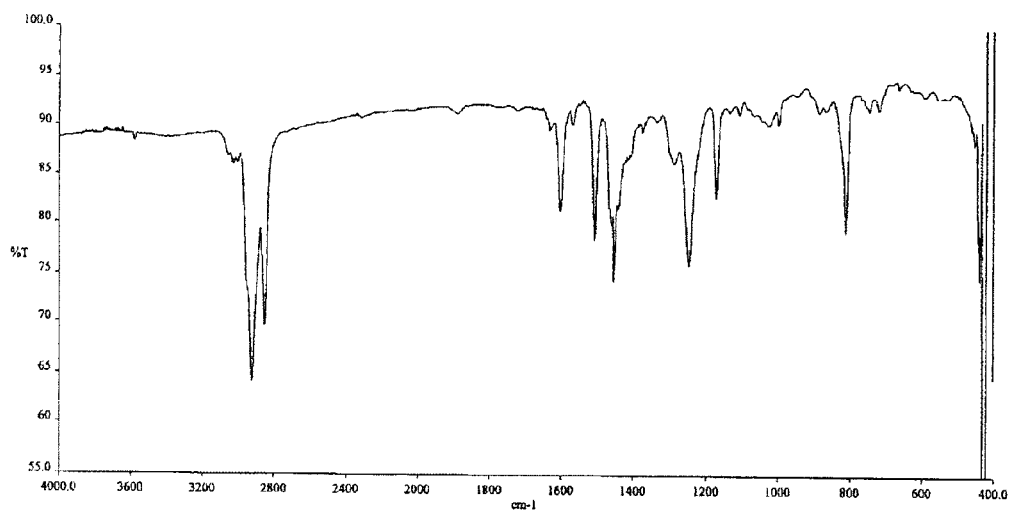
FIG. 6 shows an infrared absorption spectrum of the inventive polymer prepared in Example 6 (NaCl cast film).

The infrared absorption spectrum (NaCl cast film) is shown in FIG. 6. Gel permeation chromatography revealed the polystyrene-equivalent molecular weight as 24,500 of number average molecular weight and 70,000 of weight average molecular weight.

Example 7

An inventive yellow polymer No. 7, expressed by the formula below, was prepared in the same manner as Example 6, except that the dibromo compound of Example 6 was changed into the dibromo compound obtained in Monomer Production Example 14.

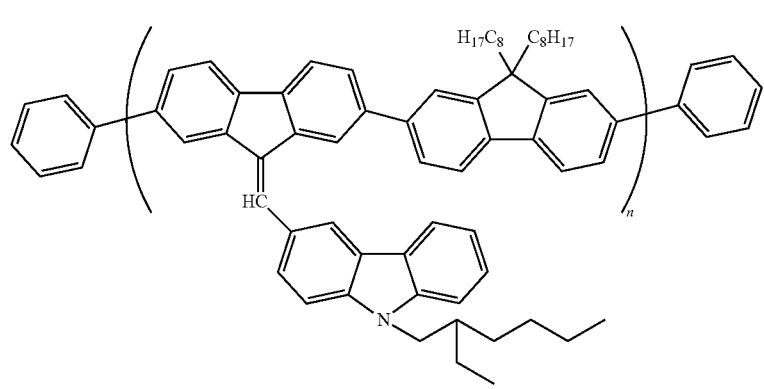

No. 7

From the analyses of the resulting substance, the elemental contents (%) of measured and (calculated) were C, 89.59 (89.84); H, 8.43 (8.50); N, 1.67 (1.66).

Figure 7:
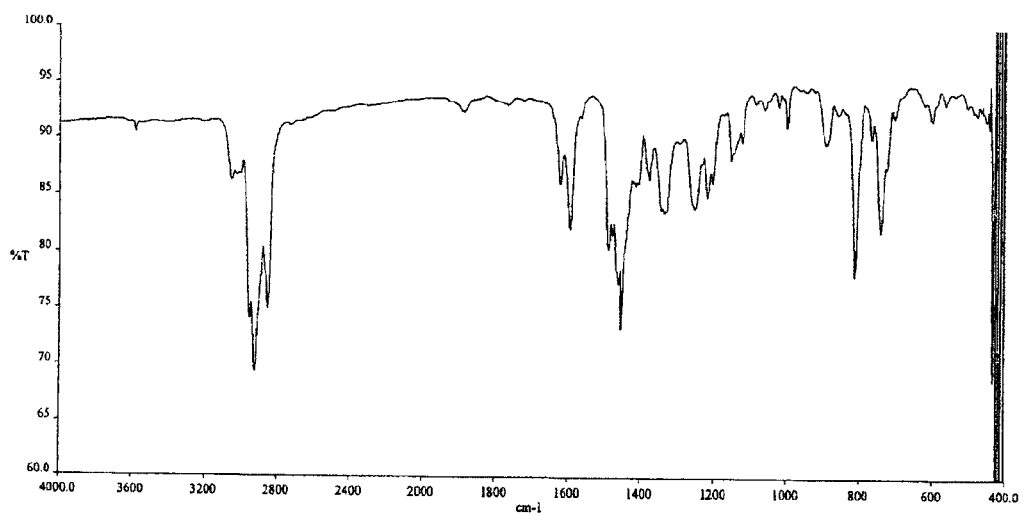
FIG. 7 shows an infrared absorption spectrum of the inventive polymer prepared in Example 7 (NaCl cast film).

The infrared absorption spectrum (NaCl cast film) is shown in FIG. 7. Gel permeation chromatography revealed the polystyrene-equivalent molecular weight as 18,800 of number average molecular weight and 69,000 of weight average molecular weight.

Example 8

An inventive yellow polymer No. 8, expressed by the formula below, was prepared in the same manner as Example 6, except that the dibromo compound of Example 6 was changed into the dibromo compound obtained in Monomer Production Example 4.

From the analyses of the resulting substance, the elemental contents (%) of measured and (calculated) were C, 91.55 (91.82); H, 8.23 (8.18).

Figure 8:
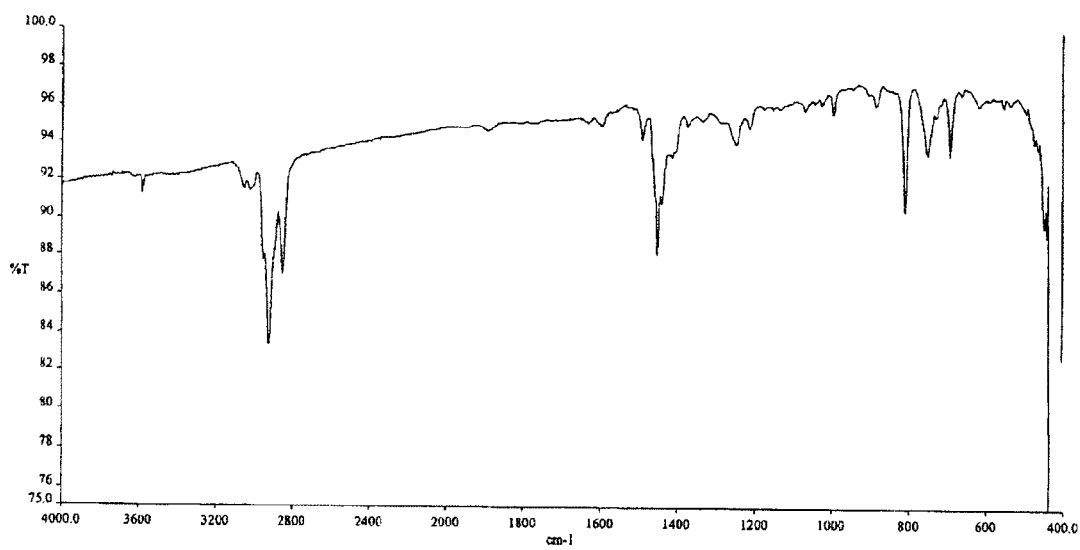
FIG. 8 shows an infrared absorption spectrum of the inventive polymer prepared in Example 8 (NaCl cast film).

The infrared absorption spectrum (NaCl cast film) is shown in FIG. 8. Gel permeation chromatography revealed the polystyrene-equivalent molecular weight as 23,900 of number average molecular weight and 68,600 of weight average molecular weight.

Example 9

A total of 2.982 g (5.0 mmol) of the dibromo compound used in Example 2, 3.213 g (5.0 mmol) of the diboronic ester expressed by the Formula (2), and 45 mg (0.11 mmol) of a phase-transfer catalyst (Aliquat 336, by Aldrich Co.) were added to a three-neck flask of 200 ml, then the flask was filled with nitrogen gas, followed by adding 29 mg (0.025 mmol) of tetrakis triphenylphosphine palladium, 30 ml of nitrogen-bubbled toluene, and 13 ml of nitrogen-bubbled 2M aqueous sodium carbonate solution in order, then the mixture was heated for 12 hours under reflux in nitrogen gas flow. In order to cause termination reaction, 243 mg (2 mmol) of phenylboronic acid was added to the reactant, and the mixture was heated under reflux for 6 hours, then 0.262 ml (2.5 mmol) of bromobenzene was added and the mixture was similarly heated under reflux for 4 hours. Thereafter, the reactant solution was cooled to room temperature, the organic layer was diluted with toluene, the solution was dripped into a mixture solvent of methanol/water to cause reprecipitation, thereby to prepare a polymer. After heating to dry the polymer, tetrahydrofuran (THF) solution of the polymer was prepared, then

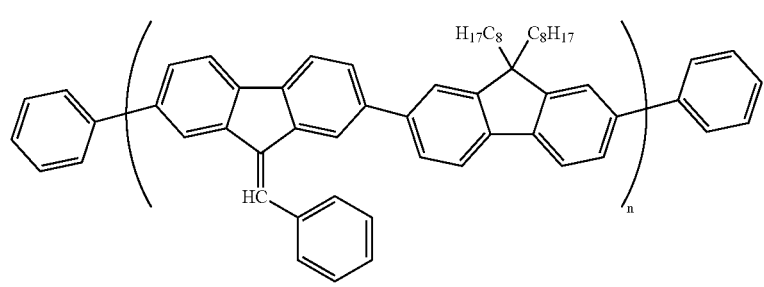

No. 8 the solution was dripped into methanol to prepare a polymer, then the polymer was taken by filtration, followed by heating and drying. The resulting polymer was dissolved into dichloromethane, then to which 1 g of a palladium scavenger (3-mercaptopropyl-functionalized silica gel, by Aldrich Co.) was added, the mixture was stirred for one hour at room temperature, then the scavenger was separated by filtration. Thereafter, the polymer solution was repeatedly rinsed with deionized water till the conductivities of deionized water came to equivalent between after and before the rinsing, then was dissolved into THF after distilling away the dichloromethane, and the solution was further dripped into methanol and the resulting polymer was taken by filtration and heated to dry thereby to prepare an inventive polymer No. 9 expressed by the formula below in an amount of 4.00 g.

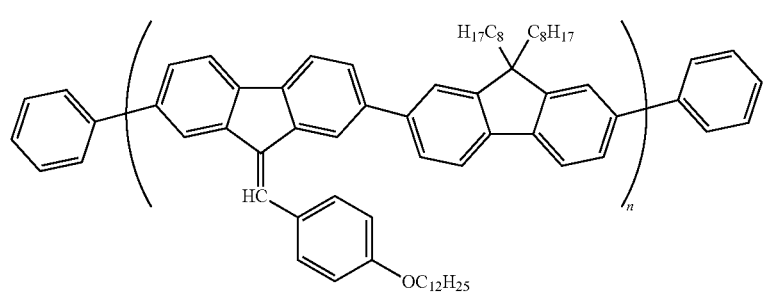

No. 9

From the analyses of the resulting substance, the elemental contents (%) of measured and (calculated) were C, 88.54 (88.78); H, 9.19 (9.28).

Figure 9:
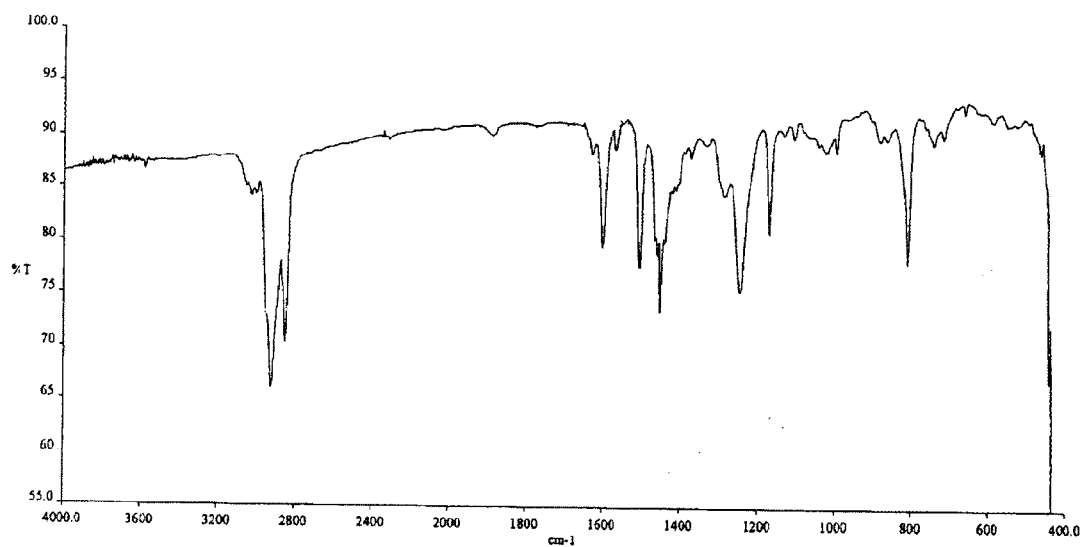
FIG. 9 shows an infrared absorption spectrum of the inventive polymer prepared in Example 9 (NaCl cast film).

The infrared absorption spectrum (NaCl cast film) is shown in FIG. 9. Gel permeation chromatography revealed the polystyrene-equivalent molecular weight as 41,200 of number average molecular weight and 146,600 of weight average molecular weight, which shows higher molecular weight of the resulting polymer compared to that of the polymer obtained in Example 2.

Example 10

An inventive yellow polymer No. 10, expressed by the formula below, was prepared in the same manner as Example 6, except that the dibromo compound of Example 6 was changed into the dibromo compound obtained in Monomer Production Example 5.

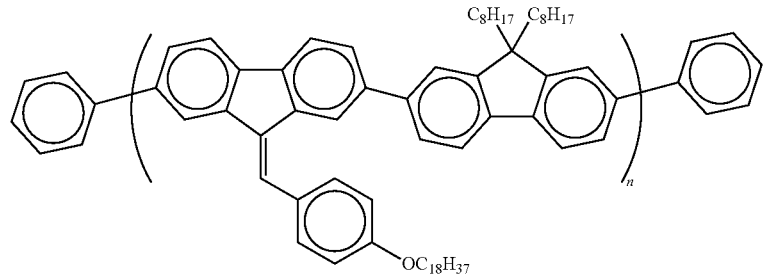

No. 10

From the analyses of the resulting substance, the elemental contents (%) of measured and (calculated) were C, 88.10 (88.49); H, 9.73 (9.75).

Figure 10:
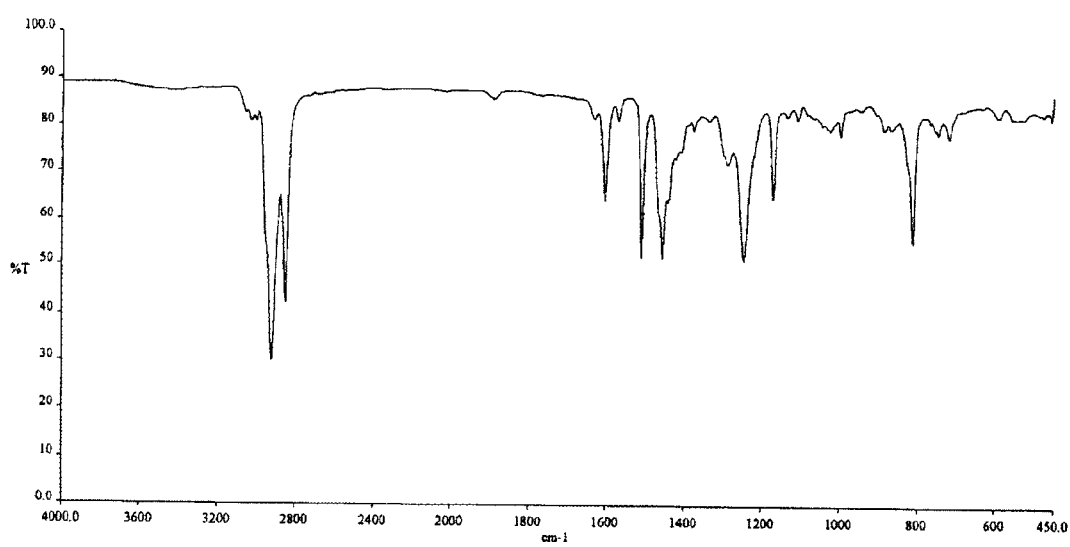
FIG. 10 shows an infrared absorption spectrum of the inventive polymer prepared in Example 10 (NaCl cast film).

The infrared absorption spectrum (NaCl cast film) is shown in FIG. 10. Gel permeation chromatography revealed the polystyrene-equivalent molecular weight as 58,700 of number average molecular weight and 198,000 of weight average molecular weight.

Example 11

An inventive yellow polymer No. 11, expressed by the formula below, was prepared in the same manner as Example 6, except that the dibromo compound of Example 6 was changed into the dibromo compound obtained in Monomer Production Example 12.

No. 11

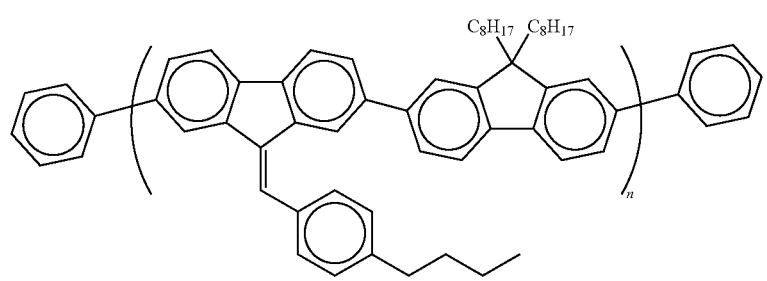

From the analyses of the resulting substance, the elemental contents (%) of measured and (calculated) were C, 90.74 (91.32); H, 8.64 (8.68).

Figure 11:
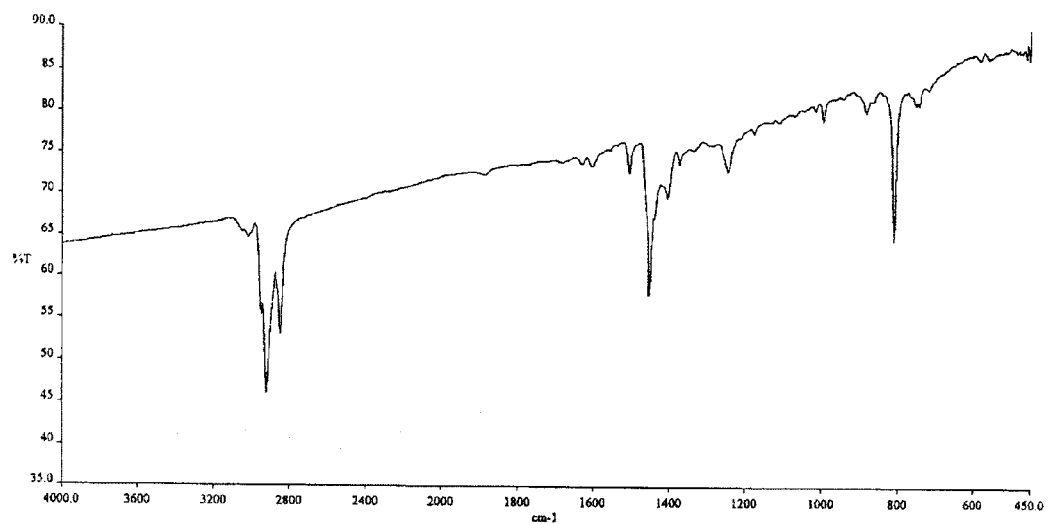
FIG. 11 shows an infrared absorption spectrum of the inventive polymer prepared in Example 11 (NaCl cast film).

The infrared absorption spectrum (NaCl cast film) is shown in FIG. 11. Gel permeation chromatography revealed the polystyrene-equivalent molecular weight as 25,000 of number average molecular weight and 88,400 of weight average molecular weight.

Example 12

An inventive yellow polymer No. 12, expressed by the formula below, was prepared in the same manner as Example 6, except that the dibromo compound of Example 6 was changed into the dibromo compound obtained in Monomer Production Example 7.

No. 12

From the analyses of the resulting substance, the elemental contents (%) of measured and (calculated) were C, 86.70 (87.00); H, 9.40 (9.44).

Figure 12:
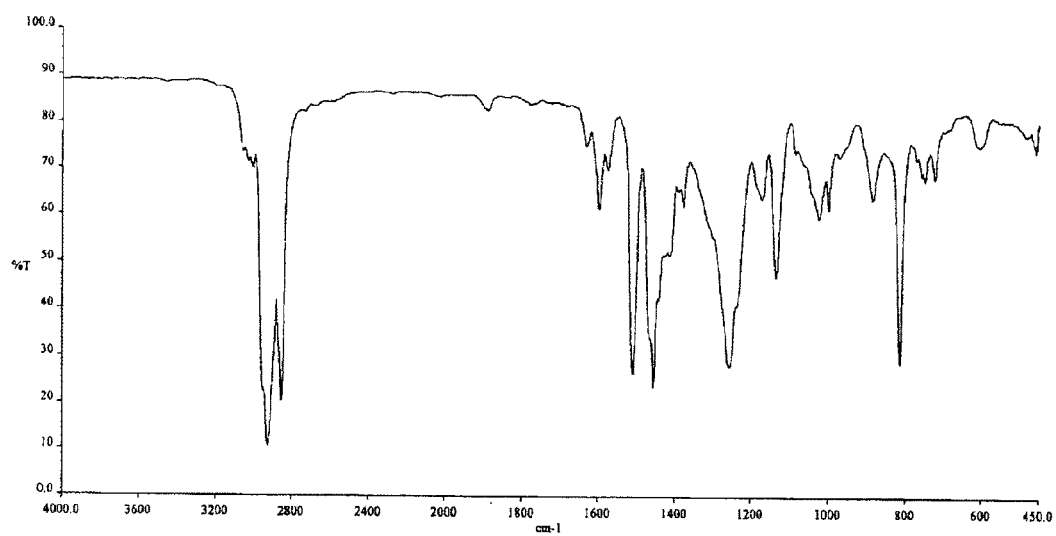
FIG. 12 shows an infrared absorption spectrum of the inventive polymer prepared in Example 12 (NaCl cast film).

The infrared absorption spectrum (NaCl cast film) is shown in FIG. 12. Gel permeation chromatography revealed the polystyrene-equivalent molecular weight as 23,100 of number average molecular weight and 69,600 of weight average molecular weight.

Example 13

An inventive yellow polymer No. 13, expressed by the formula below, was prepared in the same manner as Example 6, except that the dibromo compound of Example 6 was changed into the dibromo compound obtained in Monomer Production Example 1. There appeared a hardly-soluble gel-like substance in the intermediate reaction product, therefore, the substance was removed from the reactant before the purification processing equivalent to that of Example 6.

No. 13

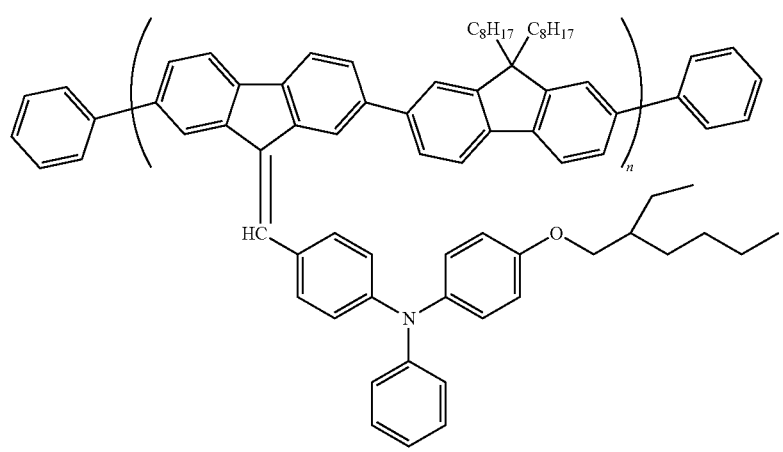

From the analyses of the resulting substance, the elemental contents (%) of measured and (calculated) were C, 88.19 (88.49); H, 8.31 (8.30); N, 1.40 (1.50).

Figure 13:
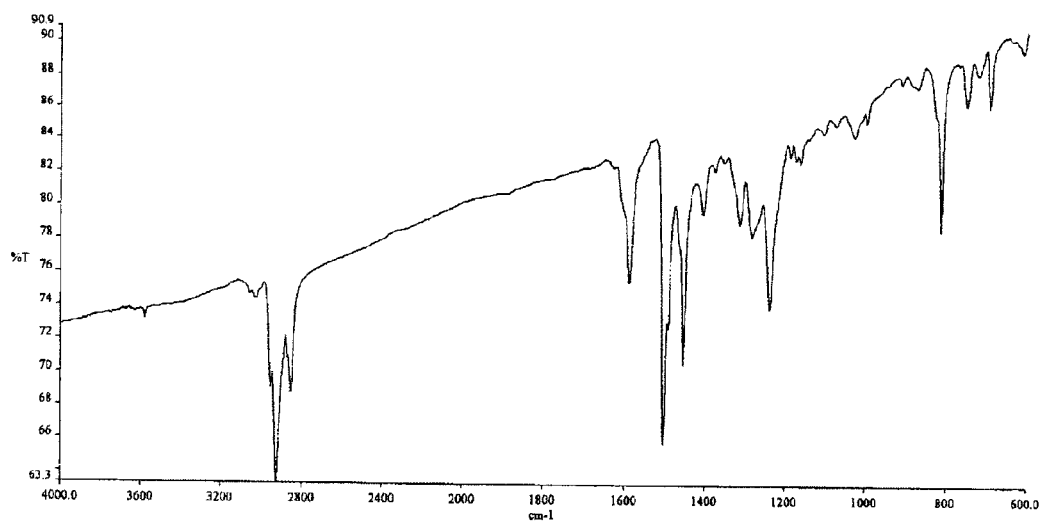
FIG. 13 shows an infrared absorption spectrum of the inventive polymer prepared in Example 13 (NaCl cast film).

The infrared absorption spectrum (NaCl cast film) is shown in FIG. 13. Gel permeation chromatography revealed the polystyrene-equivalent molecular weight as 6,900 of number average molecular weight and 32,800 of weight average molecular weight.

Example 14

An inventive yellow polymer No. 14, expressed by the formula below, was prepared in the same manner as Example 6, except that the dibromo compound of Example 6 was changed into the dibromo compound obtained in Monomer Production Example 10. There appeared a hardly-soluble gel-like substance in the intermediate reaction product, therefore, the substance was removed from the reactant before the purification processing equivalent to that of Example 6.

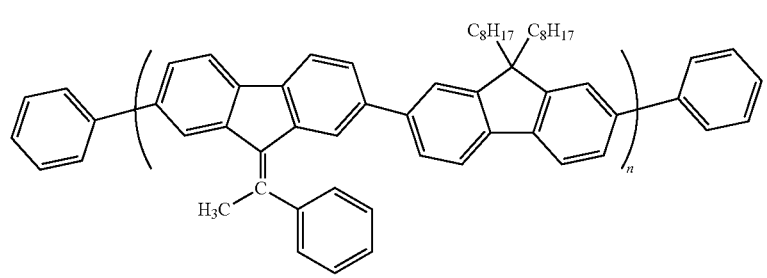

No. 14

From the analyses of the resulting substance, the elemental contents (%) of measured and (calculated) were C, 91.03 (91.67); H, 8.29 (8.33).

Figure 14:
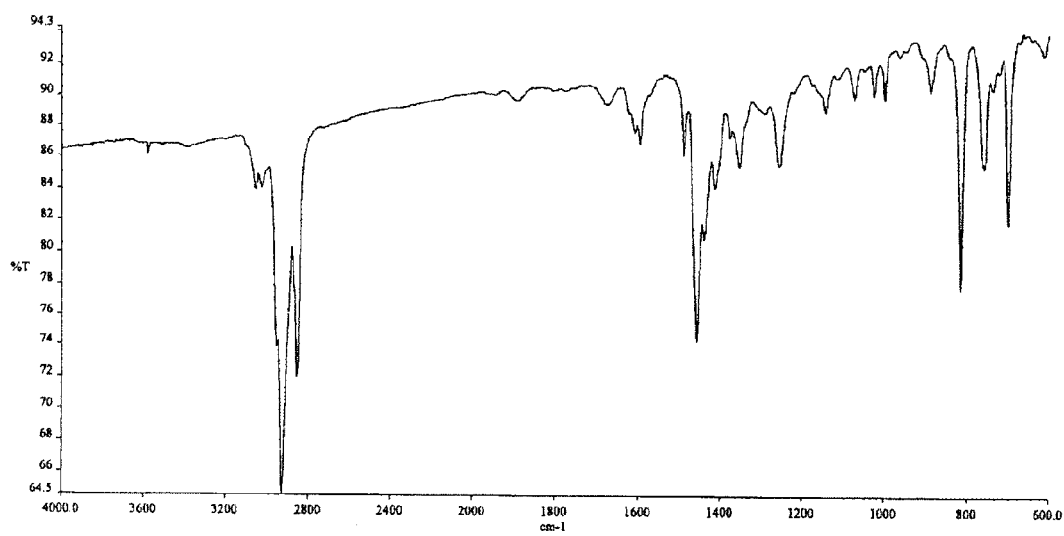
FIG. 14 shows an infrared absorption spectrum of the inventive polymer prepared in Example 14 (NaCl cast film).

The infrared absorption spectrum (NaCl cast film) is shown in FIG. 14. Gel permeation chromatography revealed the polystyrene-equivalent molecular weight as 3,800 of number average molecular weight and 10,000 of weight average molecular weight.

Example 15

An inventive yellow polymer No. 15, expressed by the formula below, was prepared in the same manner as Example 6, except that the dibromo compound of Example 6 was changed into the dibromo compound obtained in Monomer Production Example 3. There appeared a hardly-soluble gel-like substance in the intermediate reaction product, therefore, the substance was removed from the reactant before the purification processing equivalent to that of Example 6.

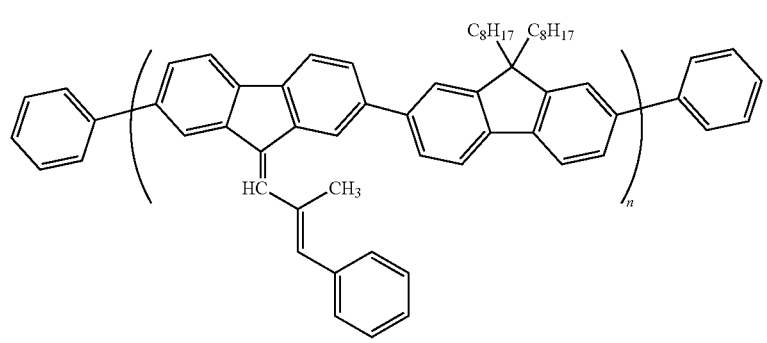

No. 15

From the analyses of the resulting substance, the elemental contents (%) of measured and (calculated) were C, 91.25 (91.70); H, 8.31 (8.30).

Figure 15:
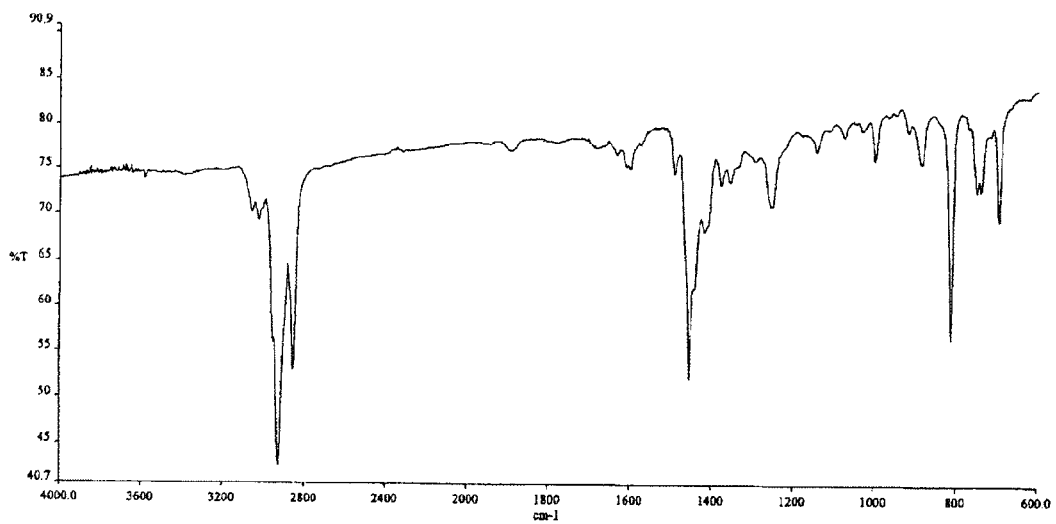
FIG. 15 shows an infrared absorption spectrum of the inventive polymer prepared in Example 15 (NaCl cast film).

The infrared absorption spectrum (NaCl cast film) is shown in FIG. 15. Gel permeation chromatography revealed the polystyrene-equivalent molecular weight as 8,700 of number average molecular weight and 22,500 of weight average molecular weight.

Example 16

An inventive yellow polymer No. 16, expressed by the formula below, was prepared in the same manner as Example 9, except that the dibromo compound of Example 9 was changed into the dibromo compound obtained in Monomer Production Example 8 and the amount of toluene was changed into 42 ml.

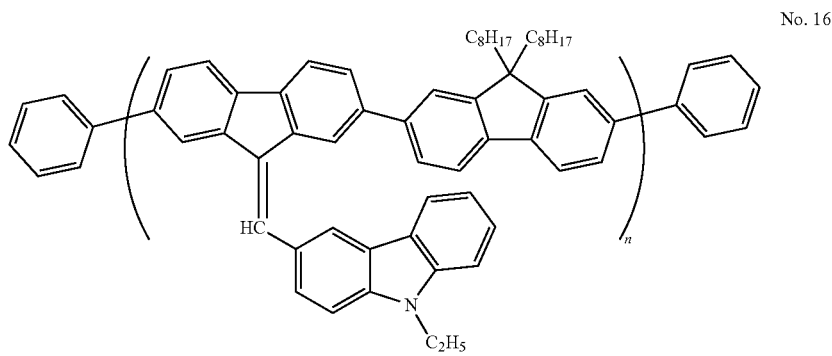

No. 16

From the analyses of the resulting substance, the elemental contents (%) of measured and (calculated) were C, 89.73 (90.29); H, 7.96 (7.86); N, 1.79 (1.85).

Figure 16:
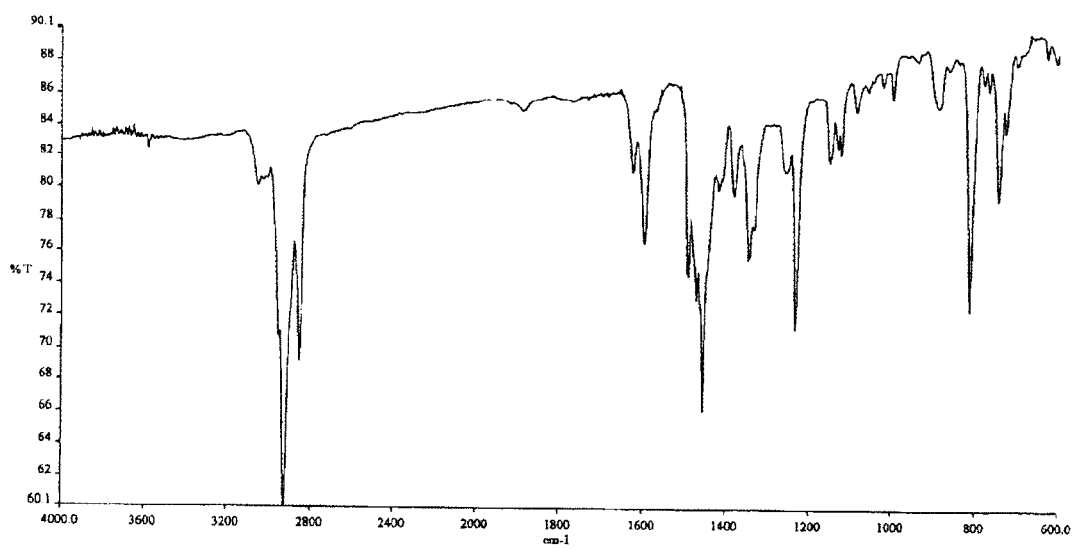
FIG. 16 shows an infrared absorption spectrum of the inventive polymer prepared in Example 16 (NaCl cast film).

The infrared absorption spectrum (NaCl cast film) is shown in FIG. 16. Gel permeation chromatography revealed the polystyrene-equivalent molecular weight as 10,200 of number average molecular weight and 28,800 of weight average molecular weight.

Example 17

An inventive red polymer No. 17, expressed by the formula below, was prepared in the same manner as Example 9, except that the dibromo compound of Example 9 was changed into the dibromo compound obtained in Monomer Production Example 13 and the amount of toluene was changed into 42 ml.

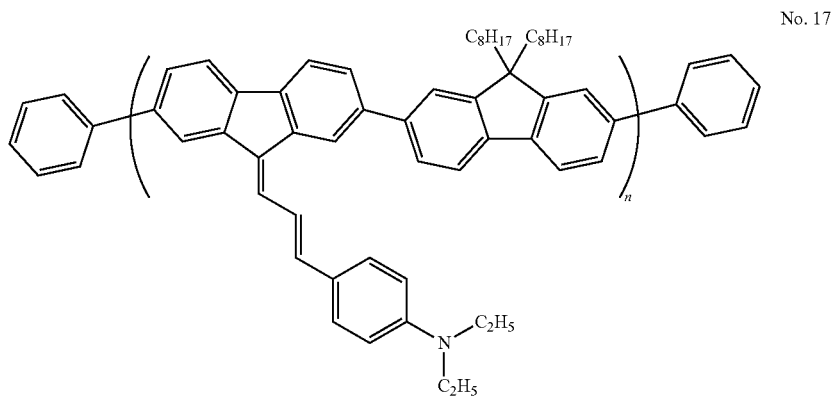

No. 17

From the analyses of the resulting substance, the elemental contents (%) of measured and (calculated) were C, 89.01 (89.48); H, 8.68 (8.62); N, 1.85 (1.90).

Figure 17:
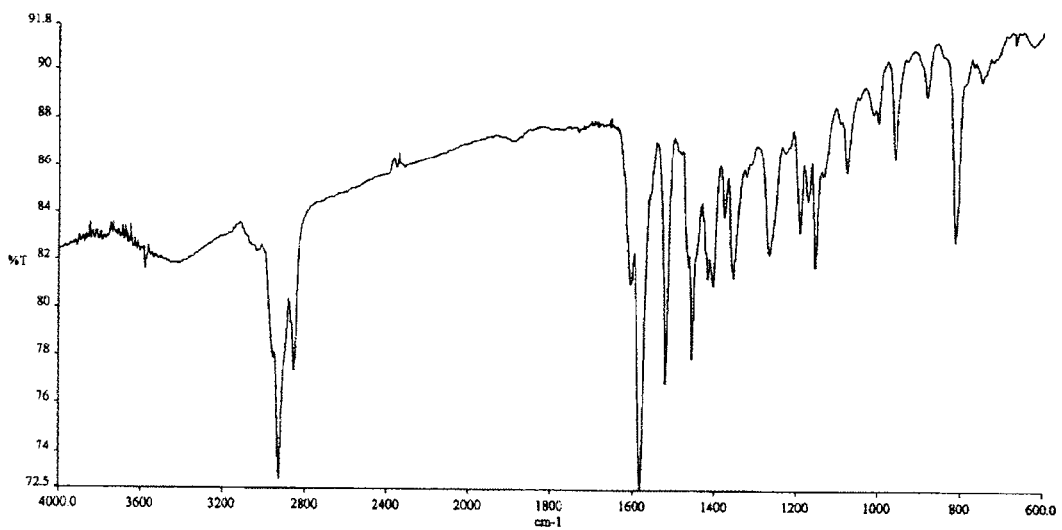
FIG. 17 shows an infrared absorption spectrum of the inventive polymer prepared in Example 17 (NaCl cast film).

The infrared absorption spectrum (NaCl cast film) is shown in FIG. 17. Gel permeation chromatography revealed the polystyrene-equivalent molecular weight as 33,100 of number average molecular weight and 146,900 of weight average molecular weight.

Example 18

An inventive yellow polymer No. 18, expressed by the formula below, was prepared in the same manner as Example 9, except that the dibromo compound of Example 9 was changed into the dibromo compound obtained in Monomer Production Example 11.

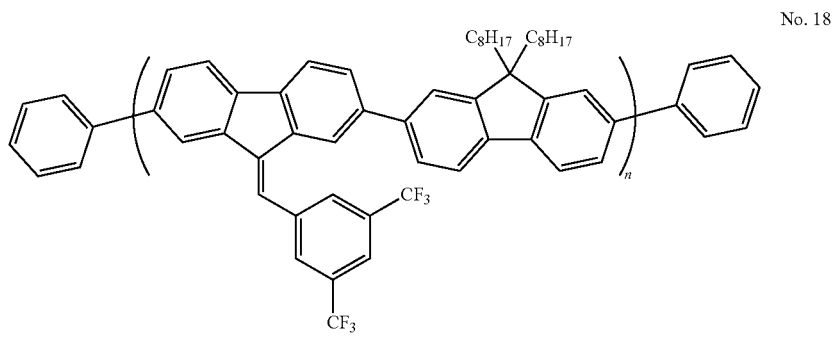

No. 18

From the analyses of the resulting substance, the elemental contents (%) of measured and (calculated) were C, 78.79 (78.83); H, 6.57 (6.50); F, 13.93 (14.67).

Figure 18:
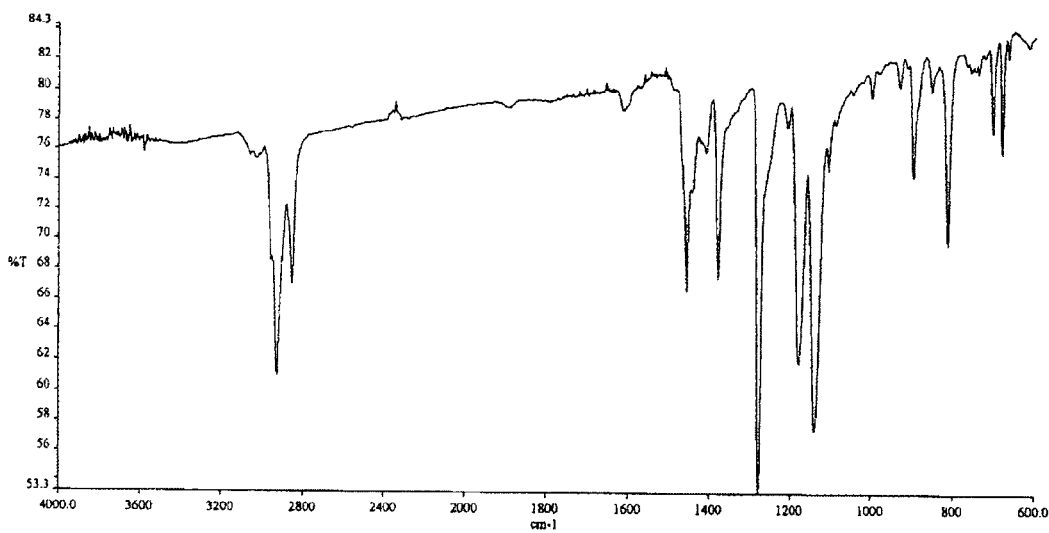
FIG. 18 shows an infrared absorption spectrum of the inventive polymer prepared in Example 18 (NaCl cast film).

The infrared absorption spectrum (NaCl cast film) is shown in FIG. 18. Gel permeation chromatography revealed the polystyrene-equivalent molecular weight as 14,000 of number average molecular weight and 38,100 of weight average molecular weight.

Example 19

An inventive yellow polymer No. 19, expressed by the formula below, was prepared in the same manner as Example 9, except that the dibromo compound of Example 9 was changed into the dibromo compound obtained in Monomer Production Example 6.

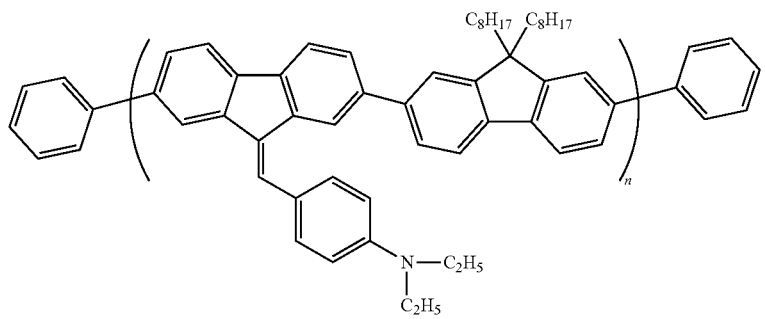

No. 19

From the analyses of the resulting substance, the elemental contents (%) of measured and (calculated) were C, 88.59 (89.38); H, 8.56 (8.65); N, 1.97 (1.97).

Figure 19:
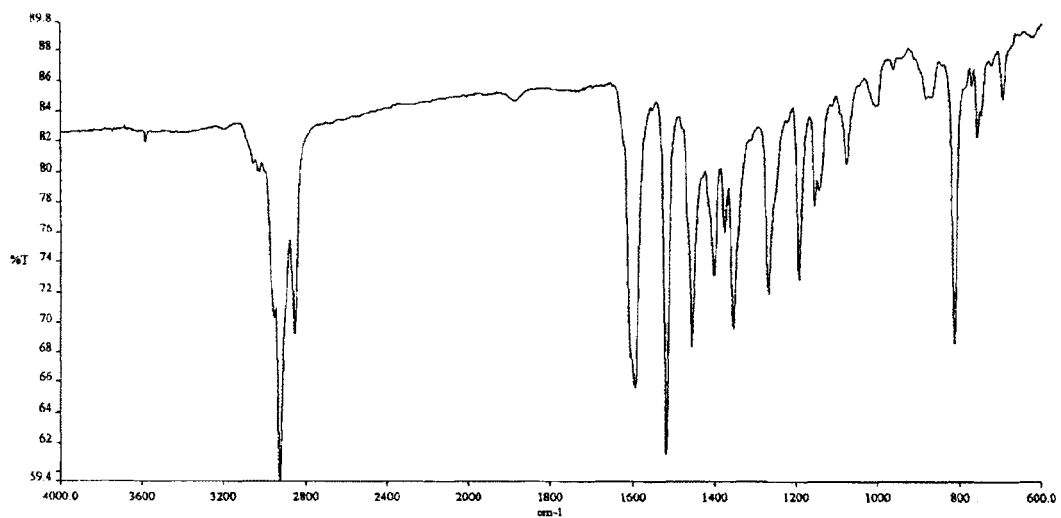
FIG. 19 shows an infrared absorption spectrum of the inventive polymer prepared in Example 19 (NaCl cast film).

The infrared absorption spectrum (NaCl cast film) is shown in FIG. 19. Gel permeation chromatography revealed the polystyrene-equivalent molecular weight as 4,300 of number average molecular weight and 16,500 of weight average molecular weight.

Example 20

An inventive yellow polymer No. 20, expressed by the formula below, was prepared in the same manner as Example 9, except that the dibromo compound of Example 9 was changed into the dibromo compound obtained in Monomer Production Example 9.

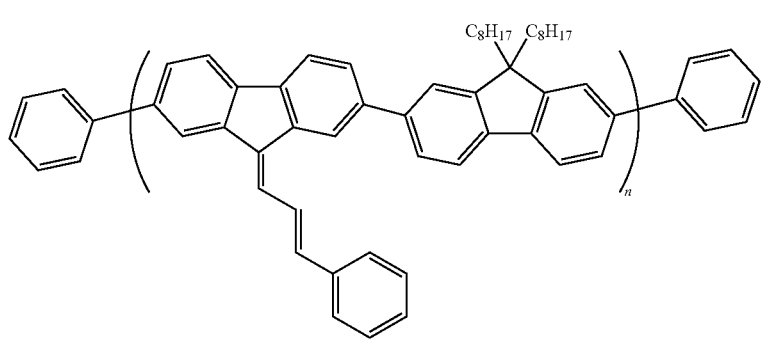

No. 20

From the analyses of the resulting substance, the elemental contents (%) of measured and (calculated) were C, 91.60 (91.82); H, 8.20 (8.18).

Figure 20:
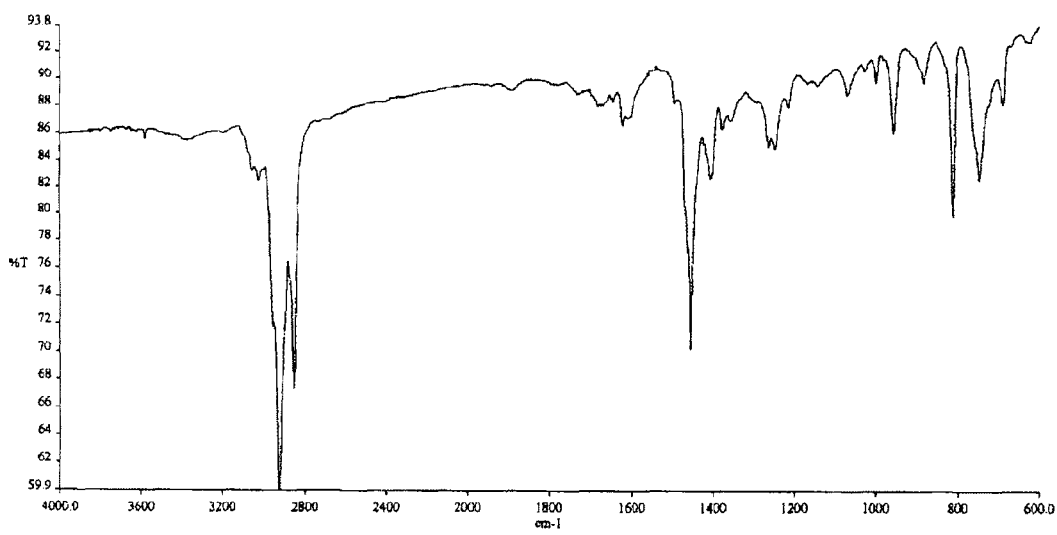
FIG. 20 shows an infrared absorption spectrum of the inventive polymer prepared in Example 20 (NaCl cast film).

The infrared absorption spectrum (NaCl cast film) is shown in FIG. 20. Gel permeation chromatography gave no measurements since the polymer being insoluble in THF.

Example 21

A total of 1.789 g (3.0 mmol) of the dibromo compound expressed by Formula (7) below, 2.264 g (3.0 mmol) of the diboronic ester expressed by the Formula (8), and 27 mg (0.067 mmol) of a phase-transfer catalyst (Aliquat 336, by Aldrich Co.) were added to a three-neck flask of 100 ml, then the flask was filled with nitrogen gas, followed by adding 17 mg (0.015 mmol) of tetrakis triphenylphosphine palladium, 18 ml of nitrogen-bubbled toluene, and 7.8 ml of nitrogen-bubbled 2M aqueous sodium carbonate solution in order, then the mixture was heated for 9.5 hours under reflux in nitrogen gas flow. In order to cause termination reaction, initially 146 mg (1.2 mmol) of phenylboronic acid was added to the reactant, and the mixture was heated under reflux for 6 hours, then 0.150 ml (1.5 mmol) of bromobenzene was added and the mixture was similarly heated under reflux for 4 hours. Thereafter, the reactant solution was cooled to room temperature, and the solution was dripped into a mixture solvent of methanol/water to cause reprecipitation, thereby to prepare a polymer. After heating to dry the polymer, tetrahydrofuran (THF) solution of the polymer was prepared, then the solution was dripped into methanol to prepare a polymer, then the polymer was taken by filtration, followed by heating and drying. The resulting polymer was dissolved into dichloromethane, then to which 1.5 g of a palladium scavenger (3-mercaptopropyl-functionalized silica gel, by Aldrich Co.) was added, the mixture was stirred for one hour at room temperature, then the scavenger was separated by filtration. Thereafter, the polymer solution was repeatedly rinsed with deionized water till the conductivities of deionized water came to equivalent between after and before the rinsing, then was dissolved into THF after distilling away the dichloromethane, and the solution was further dripped into methanol and the resulting polymer was taken by filtration and heated to dry thereby to prepare an inventive polymer No. 21 expressed by the formula below in an amount of 2.45 g.

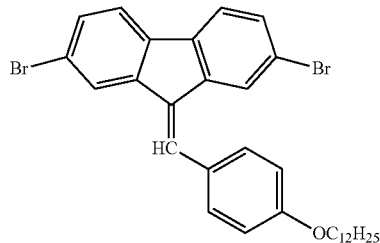

Formula (7)

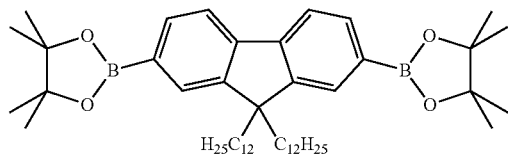

Formula (8)

-continued

No. 21

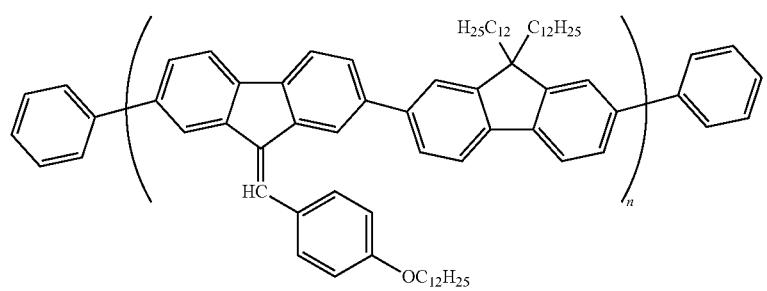

From the analyses of the resulting substance, the elemental contents (%) of measured and (calculated) were C, 88.62 (88.40); H, 9.95 (9.89).

Figure 21:
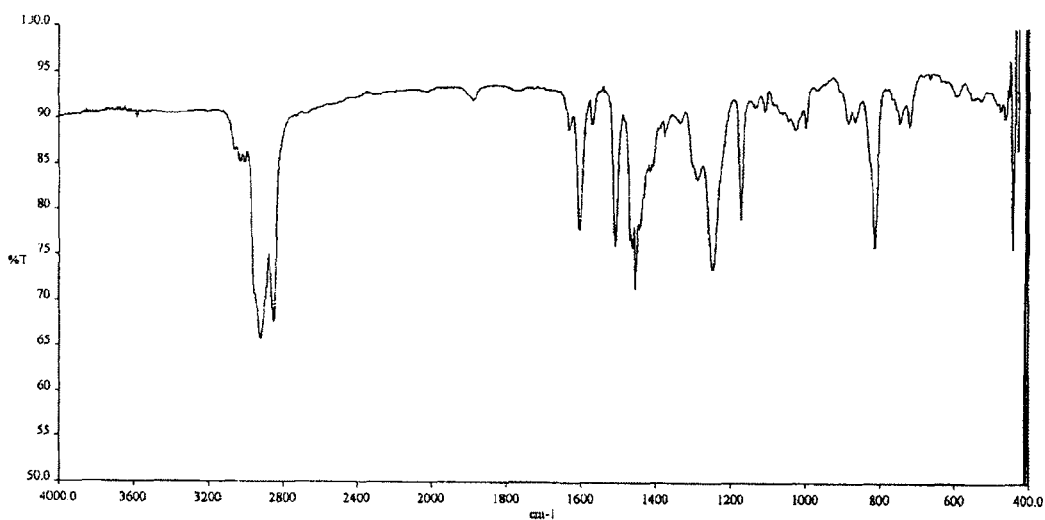
FIG. 21 shows an infrared absorption spectrum of the inventive polymer prepared in Example 21 (NaCl cast film).

The infrared absorption spectrum (NaCl cast film) is shown in FIG. 21. Gel permeation chromatography revealed the polystyrene-equivalent molecular weight as 11,400 of number average molecular weight and 28,000 of weight average molecular weight.

Preparation of Organic Thin-Film Transistor

A p-doped silicon substrate of 30 mm by 30 mm was thermally oxidized to form $SiO_2$ insulating film of 200 nm thick on the surface, then one side of the substrate was covered with a resist film (TSMR8800, by Tokyo Ohka Kogyo Co.); the other side was rinsed with hydrofluoric acid to remove the $SiO_2$ film, over which then aluminum was vapor-deposited in 300 nm thick. Thereafter, the resist film was removed using acetone to prepare a substrate for evaluating organic thin-film transistor.

An organic thin-film transistor was prepared on the substrate by use of the inventive polymer No. 3 of Example 3 as follows: the substrate was surface-treated by exposing to hexamethylenedisilazane vapor for 3 minutes followed by drying at 120° C. for 5 minutes; then a mesitylene solution containing about 1.0% by weight of the polymer No. 3 was spin-coated and dried on the substrate thereby to prepare an organic semiconductor layer of 30 nm thick; and then a source electrode and a drain electrode of 10 nm thick were vapor-deposited from gold so as to form cannel length 30 μm and cannel width 10 mm thereby to prepare an organic thin-film transistor.

Figure 22:
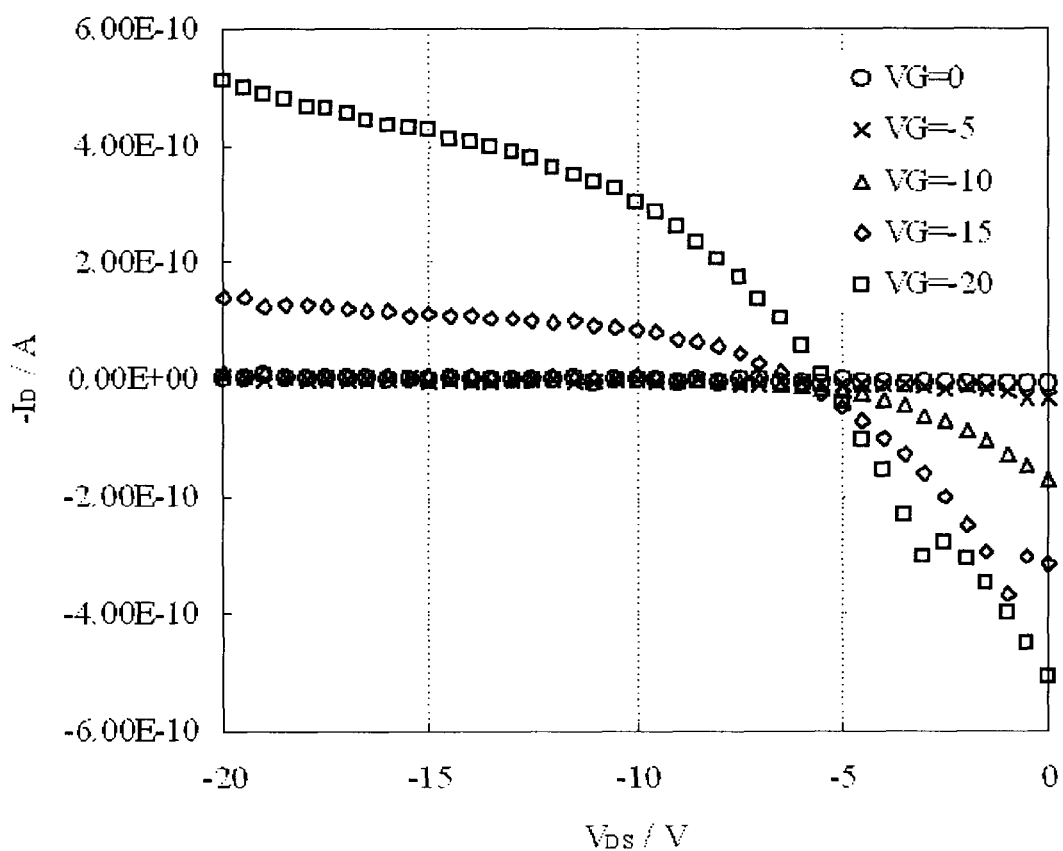
FIG. 22 shows transistor properties of an organic thin-film according to the present invention.

The resulting organic thin-film transistor demonstrates superior transistor properties as shown in FIG. 22. The electron field-effect mobility of the organic thin-film transistor was calculated as $2.5 \times 10^{-6}$ cm$^2$/Vs from the equation below:

$$Ids = \mu \cdot Cin \cdot W(Vg - Vth)^2 / 2L$$

in which, Cin: capacitance of gate insulating film per unit area, W: channel width, L: channel length, Vg: gate voltage, Ids: source drain current, μ: mobility, Vth: gate threshold voltage of channel formation.

What is claimed is:

1. A pi-conjugated polymer having consisting of a constitutional unit expressed by the General Formula (I) below:

General Formula (I)

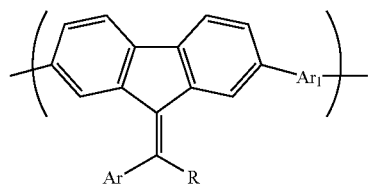

in which, Ar represents an aromatic hydrocarbon group or a heterocyclic group that may have a substituent; R represents a hydrogen atom, an alkyl group or an aromatic hydrocarbon group that may have a substituent; $Ar_1$ represents a divalent group of an aromatic hydrocarbon or heterocycle that may have a substituent, prepared by a polymerization reaction of a halogenated allylidenefluorene derivative of General Formula III and a boronic acid derivative of General Formula IV:

General Formula (III)

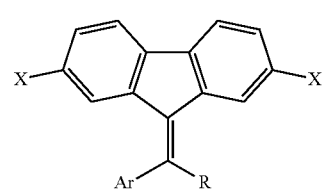

General Formula (IV)

wherein Ar, R and $Ar_1$ are as defined above; X is chlorine, bromine or iodine and Y is a boronic acid group or an ester thereof.

2. A pi-conjugated polymer consisting of a constitutional unit expressed by the General Formula (II) below:

General Formula (II)

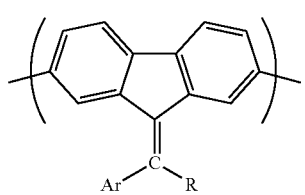

in which, Ar represents an aromatic hydrocarbon group or a heterocyclic group that may have a substituent selected from the group consisting of (i) an aromatic hydrocarbon group expressed by the formula below:

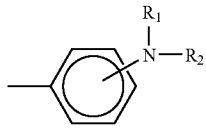

in which, $R_1$ and $R_2$ are an alkyl group, an aromatic hydrocarbon group or a heterocyclic group that may have a substituent; (ii) a heterocyclic group expressed by the formula below:

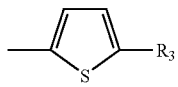

in which, $R_3$ is a hydrogen atom, an alkyl group or an alkoxy group that may have a substituent; (iii) an aromatic hydrocarbon group expressed by the formula below:

in which, $R_4$ represents a halogen atom, an alkyl group or an alkoxy group that may have a substituent; and (iv) a heterocyclic group expressed by the formula below:

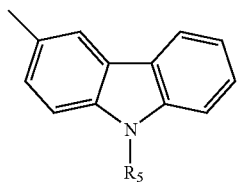

in which, $R_5$ represents an alkyl group, an aromatic hydrocarbon group or a heterocyclic group that may have a substituent; and R represents a hydrogen atom, an alkyl group or an aromatic hydrocarbon group that may have a substituent.

3. The pi-conjugated polymer according to claim 1, wherein Ar in the General Formula (I) is an aromatic hydrocarbon group expressed by the formula below:

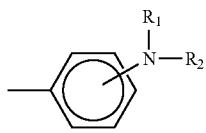

in which, $R_1$ and $R_2$ are an alkyl group, an aromatic hydrocarbon group or a heterocyclic group that may have a substituent.

4. The pi-conjugated polymer according to claim 1, wherein Ar in the General Formula (I) is a heterocyclic group expressed by the formula below:

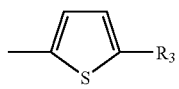

in which, $R_3$ is a hydrogen atom, an alkyl group or an alkoxy group that may have a substituent.

5. The pi-conjugated polymer according to claim 1, wherein Ar in the General Formula (I) is an aromatic hydrocarbon group expressed by the formula below:

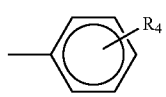

in which, $R_4$ represents a hydrogen atom, a halogen atom, an alkyl group or an alkoxy group that may have a substituent.

6. The pi-conjugated polymer according to claim 1, wherein Ar in the General Formula (I) is a heterocyclic group expressed by the formula below:

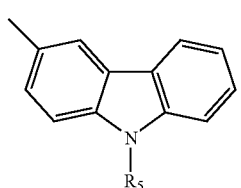

in which, $R_5$ represents an alkyl group, an aromatic hydrocarbon group or a heterocyclic group that may have a substituent.

7. The pi-conjugated polymer according to claim 2, wherein Ar in the General Formula (II) is an aromatic hydrocarbon group expressed by the formula below:

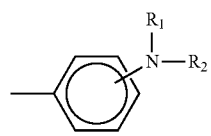

in which, $R_1$ and $R_2$ are an alkyl group, an aromatic hydrocarbon group or a heterocyclic group that may have a substituent.

8. The pi-conjugated polymer according to claim 2, wherein Ar in the General Formula (II) is a heterocyclic group expressed by the formula below:

in which, $R_3$ is a hydrogen atom, an alkyl group or an alkoxy group that may have a substituent.

9. The pi-conjugated polymer according to claim 2, wherein Ar in the General Formula (II) is an aromatic hydrocarbon group expressed by the formula below:

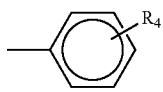

in which, $R_4$ represents a halogen atom, an alkyl group or an alkoxy group that may have a substituent.

10. The pi-conjugated polymer according to claim 2, wherein Ar in the General Formula (II) is a heterocyclic group expressed by the formula below:

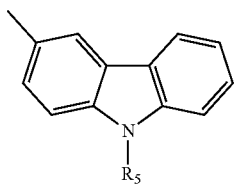

in which, $R_5$ represents an alkyl group, an aromatic hydrocarbon group or a heterocyclic group that may have a substituent.

11. The pi-conjugated polymer according to claim 1, wherein the pi-conjugated polymer has a number average molecular weight of from 1,000 to 1,000,000.

12. The pi-conjugated polymer according to claim 2, wherein the pi-conjugated polymer has a number average molecular weight of from 1,000 to 1,000,000.

13. A method for producing a pi-conjugated polymer consisting of a constitutional unit expressed by the General Formula (I) below:

General Formula (I)

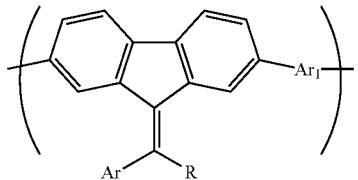

in which, Ar represents an aromatic hydrocarbon group or a heterocyclic group that may have a substituent; R represents a hydrogen atom, an alkyl group or an aromatic hydrocarbon group that may have a substituent; $Ar_1$ represents a divalent group of an aromatic hydrocarbon or heterocycle that may have a substituent, wherein the method comprises:
polymerizing a halogenated allylidenefluorene derivative of General Formula III and a boronic acid derivative of General Formula IV:

General Formula (III)

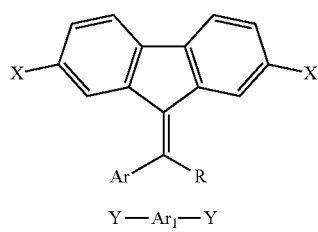

General Formula (IV)

wherein Ar, R and $Ar_1$ are as defined above; X is chlorine, bromine or iodine and Y is a boronic acid group or an ester thereof.

14. The method for producing a pi-conjugated polymer according to claim 13, wherein Ar in the General Formula (I) is an aromatic hydrocarbon group expressed by the formula below:

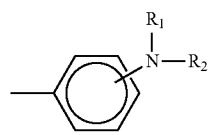

in which, $R_1$ and $R_2$ are an alkyl group, an aromatic hydrocarbon group or a heterocyclic group that may have a substituent.

15. The method for producing a pi-conjugated polymer according to claim 13, wherein Ar in the General Formula (I) is a heterocyclic group expressed by the formula below:

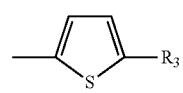

in which, $R_3$ is a hydrogen atom, an alkyl group or an alkoxy group that may have a substituent.

16. The method for producing a pi-conjugated polymer according to claim 13, wherein Ar in the General Formula (I) is an aromatic hydrocarbon group expressed by the formula below:

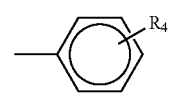

in which, $R_4$ represents a hydrogen atom, a halogen atom, an alkyl group or an alkoxy group that may have a substituent.

17. The method for producing a pi-conjugated polymer according to claim 13, wherein Ar in the General Formula (I) is a heterocyclic group expressed by the formula below:

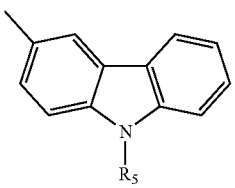

in which, $R_5$ represents an alkyl group, an aromatic hydrocarbon group or a heterocyclic group that may have a substituent.

18. The method for producing a pi-conjugated polymer according to claim 13, wherein the pi-conjugated polymer has a number average molecular weight of from 1,000 to 1,000,000.

* * * * *